US011545202B2

(12) United States Patent
Jiang et al.

(10) Patent No.: US 11,545,202 B2
(45) Date of Patent: Jan. 3, 2023

(54) CIRCUIT DESIGN AND LAYOUT WITH HIGH EMBEDDED MEMORY DENSITY

(71) Applicant: Taiwan Semiconductor Manufacturing Co., Ltd., Hsinchu (TW)

(72) Inventors: Fa-Shen Jiang, Taoyuan (TW); Hsia-Wei Chen, Taipei (TW); Hsun-Chung Kuang, Hsinchu (TW); Hai-Dang Trinh, Hsinchu (TW); Cheng-Yuan Tsai, Chu-Pei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/379,025

(22) Filed: Jul. 19, 2021

(65) Prior Publication Data

US 2022/0351766 A1 Nov. 3, 2022

Related U.S. Application Data

(60) Provisional application No. 63/182,022, filed on Apr. 30, 2021.

(51) Int. Cl.
*G11C 11/16* (2006.01)
*H01L 27/22* (2006.01)
(Continued)

(52) U.S. Cl.
CPC ........ *G11C 11/161* (2013.01); *G11C 11/1657* (2013.01); *G11C 11/1659* (2013.01);
(Continued)

(58) Field of Classification Search
CPC .............. G11C 11/161; G11C 11/1657; G11C 11/1659; G11C 11/5614; G11C 11/5657;
(Continued)

(56) References Cited

U.S. PATENT DOCUMENTS

RE46,920 E * 6/2018 Fujita .................. G11C 13/004
2006/0039183 A1* 2/2006 Lin ..................... G11C 11/5607
365/158

(Continued)

FOREIGN PATENT DOCUMENTS

JP 2007294925 A * 11/2007 ......... G11C 13/0004

*Primary Examiner* — Fernando Hidalgo

(57) ABSTRACT

Various embodiments of the present disclosure are directed towards a memory device. The memory device has a first transistor having a first source/drain and a second source/drain, where the first source/drain and the second source/drain are disposed in a semiconductor substrate. A dielectric structure is disposed over the semiconductor substrate. A first memory cell is disposed in the dielectric structure and over the semiconductor substrate, where the first memory cell has a first electrode and a second electrode, where the first electrode of the first memory cell is electrically coupled to the first source/drain of the first transistor. A second memory cell is disposed in the dielectric structure and over the semiconductor substrate, where the second memory cell has a first electrode and a second electrode, where the first electrode of the second memory cell is electrically coupled to the second source/drain of the first transistor.

20 Claims, 12 Drawing Sheets

(51) Int. Cl.

| | |
|---|---|
| ***G11C 11/56*** | (2006.01) |
| ***H01L 27/11507*** | (2017.01) |
| ***H01L 27/24*** | (2006.01) |

(52) U.S. Cl.

CPC ...... *G11C 11/5614* (2013.01); *G11C 11/5657* (2013.01); *G11C 11/5678* (2013.01); *H01L 27/11507* (2013.01); *H01L 27/228* (2013.01); *H01L 27/2436* (2013.01)

(58) Field of Classification Search

CPC ........... G11C 11/5678; H01L 27/11507; H01L 27/228; H01L 27/2436

USPC .......................................................... 365/158

See application file for complete search history.

(56) References Cited

U.S. PATENT DOCUMENTS

| | | | | |
|---|---|---|---|---|
| 2009/0161413 | A1* | 6/2009 | Yoon | G11C 11/1675<br>365/158 |
| 2019/0019553 | A1* | 1/2019 | Derner | H01L 28/55 |
| 2021/0391383 | A1* | 12/2021 | Lee | G11C 7/18 |
| 2022/0069010 | A1* | 3/2022 | Lee | H01L 27/228 |

* cited by examiner

| Operate Memory Block 502a | | |
|---|---|---|
| | Operate First Memory Cell 128a | Operate Second Memory Cell 128b |
| $124wl_1$ | 202 | 202 |
| $124wl_2$ | 206 | 206 |
| $124bl_1$ | 206 | 204 |
| $124bl_2$ | 206 | Float |
| $124bl_3$ | Float | 206 |
| $124bl_4$ | 204 | 206 |
| $124bl_5$ | 602 | 602 |
| $124bl_6$ | 602 | 602 |
| $124bl_7$ | 602 | 602 |
| $124bl_8$ | 602 | 602 |

CIRCUIT DESIGN AND LAYOUT WITH HIGH EMBEDDED MEMORY DENSITY

REFERENCE TO RELATED APPLICATIONS

This Application claims the benefit of U.S. Provisional Application No. 63/182,022, filed on Apr. 30, 2021, the contents of which are hereby incorporated by reference in their entirety.

BACKGROUND

Many modern electronic devices contain electronic memory configured to store data. Electronic memory may be volatile memory or non-volatile memory. Volatile memory stores data while it is powered, while non-volatile memory is able to keep data when power is removed. Resistive random-access memory (RRAM) is one promising candidate for next generation non-volatile memory technology due to its simple structure and compatibility with complementary metal-oxide semiconductor (CMOS) logic processes. Some other candidates for next generation non-volatile memory include magnetoresistive random-access memory (MRAM), phase-change random-access memory (PCRAM), and ferroelectric random-access memory (FeRAM).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figures 1A, 1B:
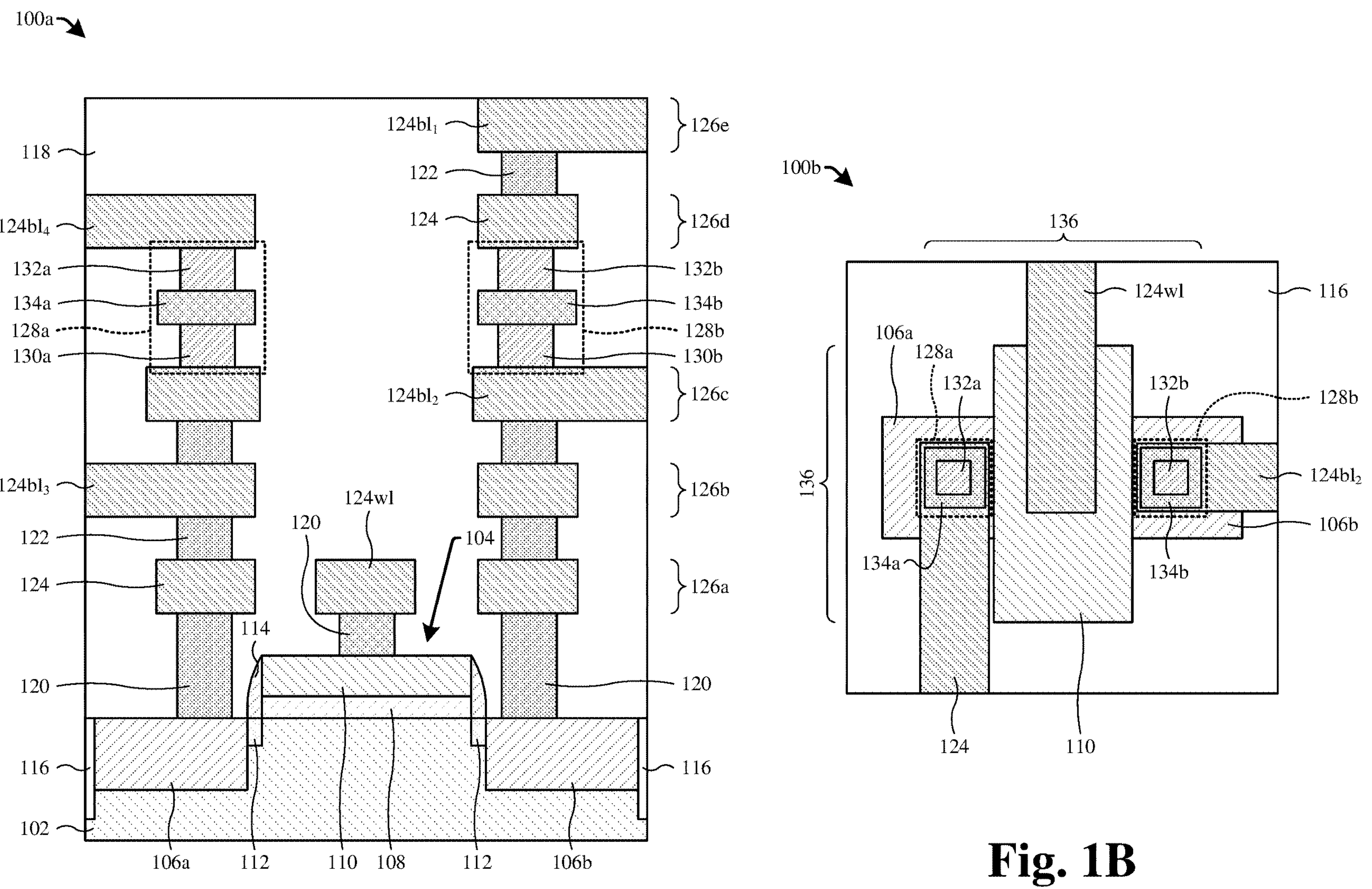
FIGS. 1A-1B illustrate various views of some embodiments of a memory device that has increased memory cell density and reduced crosstalk.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some memory devices (e.g., next generation memory devices) comprise a one transistor-one memory cell (1T1MC) device (e.g., one transistor-one resistor (1T1R) embedded memory cell architecture with an RRAM cell). The 1T1MC device comprises a resistive memory cell (e.g., RRAM cell) and an access transistor (or selector). The resistive memory cell is configured to store data based on a resistive state of the resistive memory cell. For example, the data storage structure may have a low resistance state associated with a first data state (e.g., binary “0”) or a high resistance state associated with a second data state (e.g., binary “1”). The access transistor is coupled to the resistive memory cell to control access to the resistive memory cell during read and write operations. Typically, the memory device comprises a plurality of 1T1MC devices. The plurality of 1T1MC devices are disposed in an array and define a memory array of the memory device.

There is a continued effort to scale down feature sizes of the memory device to increase the number of memory cells per unit area (e.g., increase memory cell density). As the number of memory cells per unit area continues to increase, crosstalk increases (e.g., cross-talk between memory operations of 1T1MC devices). The crosstalk negatively affects the performance of the memory device (e.g., misreads, unintended switching of memory states, undesirable increases in power consumption, etc.). As such, a memory device that increases the number of memory cells per unit area (e.g., the number of memory cells per $4F^2$ cell area) while also reducing crosstalk is desirable.

Various embodiments of the present disclosure are directed toward a memory device that increases memory cell density (e.g., the number of memory cells per $4F^2$ cell area) while also reducing crosstalk. The memory device comprises a semiconductor device (e.g., metal-oxide-semiconductor field-effect transistor (MOSFET)) disposed on a semiconductor substrate. An interlayer dielectric (ILD) is disposed over the semiconductor substrate and the semiconductor device. A first memory cell (e.g., RRAM cell) and a second memory cell are disposed in the ILD structure and over the semiconductor substrate. The first memory cell is electrically coupled to a first source/drain region of the semiconductor device and the second memory cell is electrically coupled to a second source/drain region of the semiconductor device. The first memory cell and the second memory cell are disposed with a cell area (e.g., $4F^2$ cell area).

Because both the first memory cell and the second memory cell are disposed within the cell area, the memory device of the present application has a greater cell density (e.g., number of memory cells per unit area) than the typical memory device (e.g., only one memory cell per $4F^2$ cell area). Both the first memory cell and the second memory cell may be disposed within the cell area due to, at least partially, the first memory cell being electrically coupled to the first source/drain region and the second memory cell being electrically coupled to the second source/drain region. More specifically, because the first memory cell is electrically coupled to the first source/drain region and the second memory cell is electrically coupled to the second source/drain region, the first memory cell and the second memory cell may be disposed nearer one another (e.g., within the cell area). Further, the memory device of the present application may reduce or eliminate crosstalk (e.g., block-to-block crosstalk). The memory device of the present application reduces (or eliminates) crosstalk due to the specific manner in which the memory device is operated, which is described in more detail hereinafter. Thus, the memory device of the present application may increase the number of memory cells per unit area while also reducing crosstalk.

FIGS. 1A-1B illustrate various views 100*a-b* of some embodiments of a memory device that has increased memory cell density and reduced crosstalk. FIG. 1A illustrates a cross-sectional view 100*a* of a memory device that has increased memory cell density and reduced crosstalk. FIG. 1B illustrates a layout view 100*b* of some embodiments of the memory device of FIG. 1A.

As shown in the cross-sectional view 100*a* of FIG. 1A, the memory device comprises a substrate 102. The substrate 102 comprises any type of semiconductor body (e.g., monocrystalline silicon/CMOS bulk, germanium (Ge), silicon-germanium (SiGe), a III-V semiconductor, silicon on insulator (SOI), etc.).

A semiconductor device 104 (e.g., field-effect transistor (FET), metal-oxide-semiconductor field-effect transistor (MOSFETs), etc.) is disposed in/over the substrate 102. The semiconductor device 104 comprises a pair of source/drain regions 106*a-b* disposed in the substrate 102. The source/drain regions 106*a-b* are laterally spaced. For example, the pair of source/drain regions 106*a-b* comprises a first source/drain region 106*a* laterally spaced from a second source/drain region 106*b*. The source/drain regions 106*a-b* are portions of the substrate 102 having a first doping type (e.g., n-type).

The semiconductor device 104 comprises a gate dielectric 108 and a conductive gate electrode 110. The gate dielectric 108 is disposed over the substrate 102 and between the source/drain regions 106*a-b*. The conductive gate electrode 110 overlies the gate dielectric 108. In some embodiments, the gate dielectric 108 and the conductive gate electrode 110 are collectively referred to as a gate stack. In some embodiments, the conductive gate electrode 110 is or comprises polysilicon. In such embodiments, the gate dielectric 108 may be or comprise, for example, an oxide (e.g., silicon dioxide ($SiO_2$)). In other embodiments, the conductive gate electrode 110 may be or comprise a metal, such as aluminum (Al), copper (Cu), titanium (Ti), tantalum (Ta), tungsten (W), molybdenum (Mo), cobalt (Co), or the like. In such embodiments, the gate dielectric 108 may be or comprise a high-k dielectric material, such as hafnium oxide (HfO), tantalum oxide ($Ta_xO_y$), hafnium silicon oxide (HfSiO), hafnium tantalum oxide (HfTaO), aluminum oxide ($Al_xO_y$), zirconium oxide (ZrO), or the like.

In some embodiments, the semiconductor device 104 comprises a pair of lightly-doped source/drain extensions 112 disposed in the substrate 102. In other embodiments, the pair of lightly-doped source/drain extensions 112 are omitted. The gate dielectric 108 and the conductive gate electrode 110 are disposed between the lightly-doped source/drain extensions 112. The lightly-doped source/drain extensions 112 have a same doping type as the source/drain regions 106*a-b*. The lightly-doped source/drain extensions 112 have a lower concentration of first doping type dopants (e.g., n-type dopants, such as phosphorus, arsenic, antimony, etc.) than the source/drain regions 106*a-b*.

In some embodiments, a sidewall spacer 114 is disposed over the substrate 102. In other embodiments, the sidewall spacer 114 is omitted. The sidewall spacer 114 is disposed along sidewalls of the conductive gate electrode 110 and the gate dielectric 108. The sidewall spacer laterally surrounds the conductive gate electrode 110 and the gate dielectric 108. In some embodiments, the sidewall spacer 114 may be or comprise, for example, an oxide (e.g., $SiO_2$), a nitride (e.g., silicon nitride (e.g., SiN)), an oxy-nitride (e.g., silicon oxy-nitride ($SiO_XN_Y$)), some other dielectric material, or a combination of the foregoing.

An isolation structure 116 is disposed in the substrate 102. The isolation structure 116 is configured to electrically isolate the semiconductor device 104 from other semiconductor devices (not shown) disposed in the substrate 102. In some embodiments, the isolation structure 116 comprises an oxide (e.g., $SiO_2$), a nitride (e.g., SiN)), an oxy-nitride (e.g., SiON), a carbide (e.g., silicon carbide (SiC)), some other dielectric material, or a combination of the foregoing. In further embodiments, the isolation structure 116 is a shallow trench isolation (STI) structure.

An interlayer dielectric (ILD) structure 118 is disposed over the substrate 102 and the semiconductor device 104. The ILD structure 118 comprises one or more stacked ILD layers, which may respectively comprise a low-k dielectric (e.g., a dielectric material with a dielectric constant less than about 3.9), an oxide (e.g., $SiO_2$), a nitride (e.g., SiN), an oxy-nitride (e.g., SiON), undoped silicate glass (USG), doped silicon dioxide (e.g., carbon doped silicon dioxide), borosilicate glass (BSG), phosphoric silicate glass (PSG), borophosphosilicate glass (BPSG), fluorinated silicate glass (FSG), or the like.

A plurality of conductive contacts 120 (e.g., metal contacts), a plurality of conductive vias 122 (e.g., metal vias), and a plurality of conductive lines 124 (e.g., metal lines) are disposed in the ILD structure 118. For clarity in the figures, only some of the conductive vias 122 and some of the conductive lines 124 are labeled in the figures. The plurality of conductive lines 124, the plurality of conductive vias 122, and the plurality of conductive contacts 120 are electrically coupled together in a predefined manner and are configured to provide electrical connections between various devices of the memory device. The conductive contacts 120 extend through the ILD structure 118 to contact the source/drain regions 106*a-b* and the conductive gate electrode 110. The plurality of conductive lines 124 and plurality of conductive vias 122 are disposed over the conductive contacts 120 and alternate back and forth from the conductive contacts 120 to an upper surface of the ILD structure 118.

In some embodiments, the plurality of conductive lines 124 and the plurality of conductive vias 122 may be or comprise, for example, copper (Cu), aluminum (Al), gold (Au), silver (Ag), platinum (Pt), or the like. In further embodiments, the plurality of conductive contacts 120 may be or comprise, for example, tungsten (W), copper (Cu), aluminum (Al), or the like. In yet further embodiments, the plurality of conductive lines 124, the plurality of conductive vias 122, and the plurality of conductive contacts 120 may be referred to as an interconnect structure.

The plurality of conductive lines 124 are disposed in a plurality of conductive layers 126*a-e* (e.g., metal layers). Each of the plurality of conductive layers 126*a-e* extend laterally through the ILD structure 118. Each of the plurality of conductive layers 126*a-e* comprise a group of one or more of the plurality of conductive lines 124. The plurality of conductive layers 126*a-e* are disposed over one another. The plurality of conductive vias 122 extend vertically between the plurality of conductive layers 126*a-e* and electrically couple the plurality of conductive lines 124 of the plurality of conductive layers 126*a-e* together in a predefined manner.

For example, as shown in the cross-sectional view 100*a* of FIG. 1A, the plurality of conductive layers 126*a-e* define a first conductive layer 126*a* (e.g., metal layer 1), a second conductive layer 126*b* (e.g., metal layer 2), a third conductive layer 126*c* (e.g., metal layer 3), a fourth conductive layer 126*d* (e.g., metal layer 4), and a fifth conductive layer 126*e* (e.g., metal layer 5) disposed in the ILD structure 118. The first conductive layer 126*a* comprises a first group of conductive lines of the plurality of conductive lines 124, the second conductive layer 126*b* comprises a second group of conductive lines of the plurality of conductive lines 124, the third conductive layer 126*c* comprises a third group of conductive lines of the plurality of conductive lines 124, the fourth conductive layer 126*d* comprises a fourth group of conductive lines of the plurality of conductive lines 124, and the fifth conductive layer 126*e* comprises a fifth group of conductive lines of the plurality of conductive lines 124. The second conductive layer 126*b* is disposed over the first conductive layer 126*a*, the third conductive layer 126*c* is disposed over the second conductive layer 126*b*, the fourth conductive layer 126*d* is disposed over the third conductive layer 126*c*, and the fifth conductive layer 126*e* is disposed over the fourth conductive layer 126*d*. It will be appreciated that the plurality of conductive layers 126*a-e* is not limited to only five conductive layers, but rather the plurality of conductive layers 126*a-e* may comprise any suitable number of conductive layers.

A first memory cell 128*a* and a second memory cell 128*b* are disposed in the ILD structure 118. The first memory cell 128*a* is spaced from the second memory cell 128*b*. The first memory cell 128*a* and the second memory cell 128*b* are disposed vertically between two neighboring conductive layers of the plurality of conductive layers 126*a-e*. For example, the first memory cell 128*a* and the second memory cell 128*b* are disposed vertically between the third conductive layer 126*c* and the fourth conductive layer 126*d*.

The first memory cell 128*a* and the second memory cell 128*b* comprise first electrodes 130*a-b*, respectively. The first memory cell 128*a* and the second memory cell 128*b* comprise second electrodes 132*a-b*, respectively. The first memory cell 128*a* and the second memory cell 128*b* comprise data storage structures 134*a-b*, respectively. The data storage structures 134*a-b* are disposed vertically between a corresponding one of the first electrodes 130*a-b* and a corresponding one of the second electrodes 132*a-b*. For example, the first memory cell 128*a* comprises a data storage structure 134*a* disposed between a first electrode 130*a* and a second electrode 132*a*, and the second memory cell 128*b* comprises a data storage structure 134*b* disposed between a first electrode 130*b* and a second electrode 132*b*. The first memory cell 128*a* is configured to store data (e.g., binary "0" or binary "1") based on a resistive state (e.g., a high resistive state or a low resistive state) of the data storage structure 134*a*. The second memory cell 128*b* is configured to store data (e.g., binary "0" or binary "1") based on a resistive state (e.g., a high resistive state or a low resistive state) of the data storage structure 134*b*.

In some embodiments, the first electrodes 130*a-b* may be or comprise, for example, a metal (e.g., aluminum (Al), titanium (Ti), tantalum (Ta), gold (Au), platinum (Pt), tungsten (W), nickel (Ni), iridium (Ir), etc.), a metal-nitride (e.g., titanium nitride (TiN), tantalum nitride (TaN), etc.), a metal-oxide (e.g., iridium oxide ($IrO_2$)), doped polysilicon (e.g., n-type/p-type polysilicon), or the like. In some embodiments, the second electrodes 132*a-b* may be or comprise, for example, a metal (e.g., Al, Ti, Ta, Au, Pt, W, Ni, Ir, etc.), a metal-nitride (e.g., TiN, TaN, etc.), a metal-oxide (e.g., $IrO_2$), doped polysilicon (e.g., n-type/p-type polysilicon), or the like. In further embodiments, the first electrodes 130*a-b* and the second electrodes 132*a-b* are or comprise a same material. In other embodiments, the first electrodes 130*a-b* and the second electrodes 132*a-b* are or comprise different materials.

In some embodiments, the data storage structures 134*a-b* are or comprise, for example, a chalcogenide (e.g., germanium-antimony-tellurium (GST)), a ferroelectric crystal material (e.g., lead zirconate titanate (PZT)), a metal-oxide (e.g., hafnium oxide ($Hf_XO_Y$), zirconium-oxide ($Hf_XZr_YO_Z$), etc.), a component-metal-oxide (e.g., hafnium-silicon-oxide ($Hf_XSi_YO_Z$), hafnium-aluminum-oxide ($Hf_XAl_YO_Z$), strontium titanate (STO), etc.), a metal-oxynitride (e.g., hafnium oxynitride ($Hf_XO_YN_Z$)), or some other material that may selectively change between a high resistive state and a low resistive state. In further embodiments, the data storage structures 134*a-b* may be a magnetic tunnel junction (MTJ). In such embodiments, the MTJ comprises at least two magnetic layers (e.g., ferromagnetic layers) separated by an insulating tunnel barrier. In further such embodiments, the magnetic layers may be or comprise, for example, cobalt (Co), iron (Fe), boron (B), nickel (Ni), ruthenium (Ru), iridium (Ir), platinum (Pt), or the like, and the insulating tunnel barrier layer may be or comprise, for example, magnesium oxide (MgO), aluminum oxide ($Al_2O_3$), or the like.

The first electrode 130*a* of the first memory cell 128*a* is electrically coupled to the first source/drain region 106*a* and to a third bit line 124$bl_3$. The first electrode 130$a$ of the first memory cell 128$a$ is electrically coupled to the first source/drain region 106$a$ via a first conductive path. For example, the first conductive path is defined by a first conductive line of the one or more conductive lines of the third conductive layer 126$c$ (e.g., the third group of conductive lines of the plurality of conductive lines 124), a first conductive via of the plurality of conductive vias 122, a first conductive line of the one or more conductive lines of the second conductive layer 126$b$ (e.g., the second group of conductive lines of the plurality of conductive lines 124), a second conductive via of the plurality of conductive vias 122, a first conductive line of the one or more conductive lines of the first conductive layer 126$a$ (e.g., the first group of conductive lines of the plurality of conductive lines 124), and a first conductive contact of the plurality of conductive contacts 120.

The first electrode 130$a$ of the first memory cell 128$a$ is electrically coupled to the first conductive line of the one or more conductive lines of the third conductive layer 126$c$. In some embodiments, the first electrode 130$a$ of the first memory cell 128$a$ (directly) contacts the first conductive line of the one or more conductive lines of the third conductive layer 126$c$. The first conductive via of the plurality of conductive vias 122 electrically couples the first conductive line of the one or more conductive lines of the third conductive layer 126$c$ to the first conductive line of the one or more conductive lines of the second conductive layer 126$b$. In some embodiments, the first conductive line of the one or more conductive lines of the second conductive layer 126$b$ is the third bit line 124$bl_3$. The second conductive via of the plurality of conductive vias 122 electrically couples the third bit line 124$bl_3$ to the first conductive line of the one or more conductive lines of the first conductive layer 126$a$. The first conductive contact of the plurality of conductive contacts 120 electrically couples the first conductive line of the one or more conductive lines of the first conductive layer 126$a$ to the first source/drain region 106$a$.

The second electrode 132$a$ of the first memory cell 128$a$ is electrically coupled to a fourth bit line 124$bl_4$. In some embodiments, a first conductive line of the one or more conductive lines of the fourth conductive layer 126$d$ (e.g., the fourth group of conductive lines of the plurality of conductive lines 124) is the fourth bit line 124$bl_4$. In further embodiments, the second electrode 132$a$ of the first memory cell 128$a$ (directly) contacts the fourth bit line 124$bl_4$. It will be appreciated that the second electrode 132$a$ of the first memory cell 128$a$ may be electrically coupled to the fourth bit line 124$bl_4$ via some other conductive path that is defined by one or more of the plurality of conductive lines 124 and/or one or more of the plurality of conductive vias 122.

The first electrode 130$b$ of the second memory cell 128$b$ is electrically coupled to the second source/drain region 106$b$ and a second bit line 124$bl_2$. The first electrode 130$b$ of the second memory cell 128$b$ is electrically coupled to the second source/drain region 106$b$ via a second conductive path. For example, the second conductive path is defined by a second conductive line of the one or more conductive lines of the third conductive layer 126$c$, a third conductive via of the plurality of conductive vias 122, a second conductive line of the one or more conductive lines of the second conductive layer 126$b$, a fourth conductive via of the plurality of conductive vias 122, a second conductive line of the one or more conductive lines of the first conductive layer 126$a$, and a second conductive contact of the plurality of conductive contacts 120.

The first electrode 130$b$ of the second memory cell 128$b$ is electrically coupled to the second conductive line of the one or more conductive lines of the third conductive layer 126$c$. In some embodiments, the second conductive line of the one or more conductive lines of the third conductive layer 126$c$ is the second bit line 124$bl_2$. In further embodiments, the first electrode 130$b$ of the second memory cell 128$b$ (directly) contacts the second bit line 124$bl_2$.

The third conductive via of the plurality of conductive vias 122 electrically couples the second bit line 124$bl_2$ to the second conductive line of the one or more conductive lines of the second conductive layer 126$b$. The fourth conductive via of the plurality of conductive vias 122 electrically couples the second conductive line of the one or more conductive lines of the second conductive layer 126$b$ to the second conductive line of the one or more conductive lines of the first conductive layer 126$a$. The second conductive contact of the plurality of conductive contacts 120 electrically couples the second conductive line of the one or more conductive lines of the first conductive layer 126$a$ to the second source/drain region 106$b$.

The second electrode 132$b$ of the second memory cell 128$b$ is electrically coupled to a first bit line 124$bl_1$. In some embodiments, a first conductive line of the one or more conductive lines of the fifth conductive layer 126$e$ (e.g., the fifth group of conductive lines of the plurality of conductive lines 124) is the first bit line 124$bl_1$. The second electrode 132$b$ of the second memory cell 128$b$ is electrically coupled to the first bit line 124$bl_1$ via a third conductive path. For example, the third conductive path is defined by a second conductive line of the one or more conductive lines of the fourth conductive layer 126$d$ and a fifth conductive via of the plurality of conductive vias 122.

The second electrode 132$b$ of the second memory cell 128$b$ is electrically coupled to the second conductive line of the one or more conductive lines of the fourth conductive layer 126$d$. In some embodiments, the second electrode 132$b$ of the second memory cell 128$b$ (directly) contacts the second conductive line of the one or more conductive lines of the fourth conductive layer 126$d$. The fifth conductive via of the plurality of conductive vias 122 electrically couples the second conductive line of the one or more conductive lines of the fourth conductive layer 126$d$ to the first bit line 124$bl_1$. The first conductive path, the second conductive path, and the third conductive path (and the other conductive path that may electrically couple the second electrode 132$a$ of the first memory cell 128$a$ to the fourth bit line) are spaced from one another. In other words, the conductive features (e.g., conductive lines, conductive vias, conductive contacts, etc.) that define the first conductive path are spaced from the conductive features that define the second conductive path and the conductive features that define the third conductive path (and the conductive features that define the other conductive path), the conductive features that define the second conductive path are spaced from the conductive features that define the first conductive path and the conductive features that define the third conductive path, and so forth.

The conductive gate electrode 110 of the semiconductor device 104 is electrically coupled to a word line 124$wl$. In some embodiments, a third conductive line of the one or more conductive lines of the first conductive layer 126$a$ is the word line 124$wl$. The conductive gate electrode 110 is electrically coupled to the word line 124$wl$ via a fourth conductive path. For example, the fourth conductive path is defined by a sixth conductive via of the plurality of conductive vias 122. The sixth conductive via of the plurality of conductive vias 122 electrically couples the conductive gate electrode 110 to the word line 124$wl$.

As shown in the layout view 100*b* of FIG. 1B, the first memory cell 128*a* and the second memory cell 128*b* are disposed within a cell area (e.g., within a perimeter of the cell area). In some embodiments, the cell area is equal to the square of a distance 136 multiplied by four. In further embodiments, the cell area is a minimum size (e.g., area) of the semiconductor device 104. In some embodiments, the distance 136 is a minimum feature size (e.g., F) of the memory device. For example, in some embodiments, the cell area is equal to $4F^2$, where F is a minimum feature size. In some embodiments, the distance 136 may be between about 0.01 micrometers (μm) and about 0.9 μm. In other embodiments, a width of the cell area (e.g., the distance 136 in a first direction) is different than a length of the cell area (e.g., a different distance in a second direction perpendicular to the first direction). In such embodiments, the cell area is equal to $4(W \times L)^2$, where W is the width of the cell area and L is the length of the cell area. In further such embodiments, the width of the cell area may be between about 0.1 μm and about 0.9 μm, and the length of the cell area may be between about 0.01 μm and about 0.3 μm.

A typical memory device only comprises a single memory cell disposed within the cell area (e.g., only one memory cell disposed within the perimeter of the cell area). Because both the first memory cell 128*a* and the second memory cell 128*b* are disposed within the cell area, the memory device of the present application has a greater cell density (e.g., number of memory cells per unit area) than the typical memory device. Both the first memory cell 128*a* and the second memory cell 128*b* may be disposed within the cell area due to, at least partially, the first memory cell 128*a* being electrically coupled to the first source/drain region 106*a* and the second memory cell 128*b* being electrically coupled to the second source/drain region 106*b*. More specifically, because the first memory cell 128*a* is electrically coupled to the first source/drain region 106*a* and the second memory cell 128*b* is electrically coupled to the second source/drain region 106*b*, the first memory cell 128*a* and the second memory cell 128*b* may be disposed nearer one another (e.g., within the cell area).

Figure 2A:
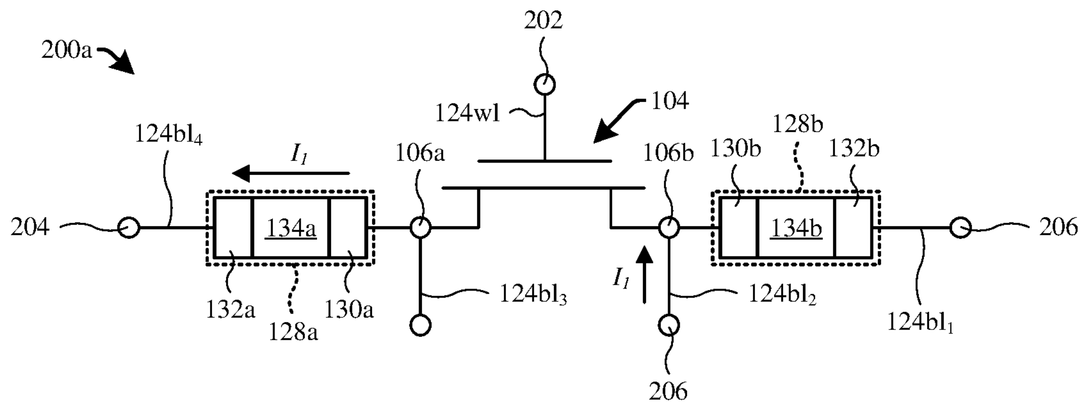
FIGS. 2A-2B illustrate various circuit diagrams of equivalent circuits of some embodiments of the memory device of FIGS. 1A-1B.
Figure 2B:
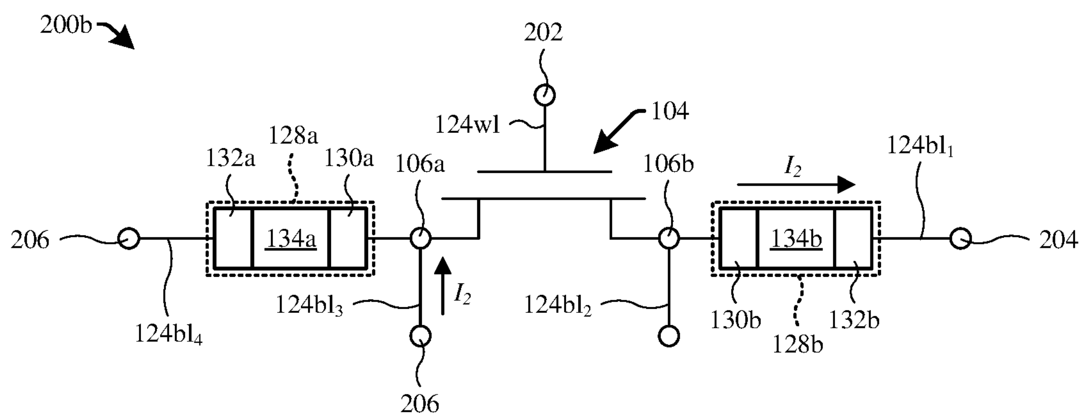

FIGS. 2A-2B illustrate various circuit diagrams 200*a-b* of equivalent circuits of some embodiments of the memory device of FIGS. 1A-1B. The circuit diagram 200*a* of FIG. 2A illustrates operating the first memory cell 128*a* (e.g., the memory operation rule for operating the first memory cell) of some embodiments of the memory device of FIGS. 1A-1B. The circuit diagram 200*b* of FIG. 2B illustrates operating the second memory cell 128*b* (e.g., the memory operation rule for operating the second memory cell) of some embodiments of the memory device of FIGS. 1A-1B.

As shown in the circuit diagram 200*a* of FIG. 2A, to operate the first memory cell 128*a* (e.g., write, erase, or read the first memory cell 128*a*), a first current $I_1$ is passed through the first memory cell 128*a*. To pass the first current $I_1$ through the first memory device 128*a* a first voltage 202 is applied to the conductive gate electrode 110 of the semiconductor device 104. In some embodiments, the first voltage 202 is referred to as a gate voltage (e.g., VG). The first voltage 202 is applied to the conductive gate electrode 110 of the semiconductor device 104 via the word line 124*wl*. By applying the first voltage 202 to the conductive gate electrode 110 of the semiconductor device 104, the semiconductor device 104 is placed in an "ON" state (e.g., a state in which a conductive channel exists between the first source/drain region 106*a* and the second source/drain region 106*b*). In some embodiments, the semiconductor device 104 is placed in the "ON" state due to the first voltage being above a threshold voltage (e.g., $V_{th}$) of the semiconductor device 104. In some embodiments, the first voltage 202 is between about 0.2 volts (V) and about 4 V. In further embodiments, the threshold voltage of the semiconductor device 104 is between about 0.2 V and about 0.7 V.

Further, a second voltage 204 (e.g., $V_{DD}$) is applied to the second electrode 132*a* of the first memory cell 128*a*. The second voltage 204 is applied to the second electrode 132*a* of the first memory cell 128*a* via the fourth bit line 124*bl*$_4$. In some embodiments, the second voltage 204 is between about −2 V and about 2 V.

The magnitude and polarity of the second voltage 204 is dependent on the specific operation that is being performed on the first memory cell 128*a*. For example, the second voltage 204 is within a first voltage range during a write operation (e.g., SET), a second voltage range during an erase operation (e.g., RESET), and a third voltage range during a read operation. In some embodiments, the first voltage range is between about 0 V and about 2 V. In some embodiments, the second voltage range is between about 0 V and about −2V. In some embodiments, the third voltage range is between about 0.1 V and about 0.3 V.

The write operation (e.g., SET) switches the data storage structure 134*a* from a high resistance state (e.g., binary "1") to a low resistance state (e.g., binary "0"), or vice versa. The erase operation switches the data storage structure 134*a* from the low resistance state to the high resistance state, or vice versa. The read operation probes the first memory cell 128*a* to determine the data storage state (e.g., binary "1" or binary "0") of the data storage structure 134*a*.

Moreover, a third voltage 206 is applied to the second source/drain region 106*b* of the semiconductor device 104 and to the first electrode 130*b* of the second memory cell 128*b*. The third voltage 206 is applied to the second source/drain region 106*b* and to the first electrode 130*b* via the second bit line 124*bl*$_2$. Also, the third voltage 206 is applied to the second electrode 132*b* of the second memory cell 128*b*. The third voltage 206 is applied to the second electrode 132*b* of the second memory cell 128*b* via the first bit line 124*bl*$_1$. The third voltage 206 is ground (e.g., 0 V). In addition, the first source/drain region 106*a* of the semiconductor device 104 and the first electrode 130*a* of the first memory cell 128*a* are left floating (e.g., neither are driven to a specific voltage via the third bit line 124*bl*$_3$). As such, the first current $I_1$ passes through the first memory cell 128*a* from the second bit line 124*bl*$_2$ to the fourth bit line 124*bl*$_4$.

As shown in the circuit diagram 200*b* of FIG. 2B, to operate the second memory cell 128*b* (e.g., write, erase, or read the second memory cell 128*b*), a second current 12 is passed through the second memory cell 128*b*. The second current 12 passes through the second memory cell 128*b* from the third bit line 124*bl*$_3$ to the first bit line 124*bl*$_1$. To pass the second current 12 through the second memory cell 128*b* from the third bit line 124*bl*$_3$ to the first bit line 124*bl*$_1$, the first voltage 202 is applied to the conductive gate electrode 110 of the semiconductor device 104 via the word line 124*wl*. Further, the second voltage 204 is applied to the second electrode 132*b* of the second memory cell 128*b* via the first bit line 124*bl*$_1$. Moreover, the third voltage 206 is applied to the first source/drain region 106*a* of the semiconductor device 104 and to the first electrode 130*a* of the first memory cell 128*a* via the third bit line 124*bl*$_3$. Also, the third voltage 206 is applied to the second electrode 132*a* of the first memory cell 128*a* via the fourth bit line 124*bl*$_4$. In addition, the second source/drain region 106*b* of the semiconductor device 104 and the first electrode 130*b* of the second memory cell 128*b* are left floating (e.g., neither are driven to a specific voltage via the second bit line 124*bl*$_2$). As such, the second current 12 passes through the second memory cell 128*b* from the third bit line 124*bl*$_3$ to the first bit line 124*bl*$_1$.

Figure 3:
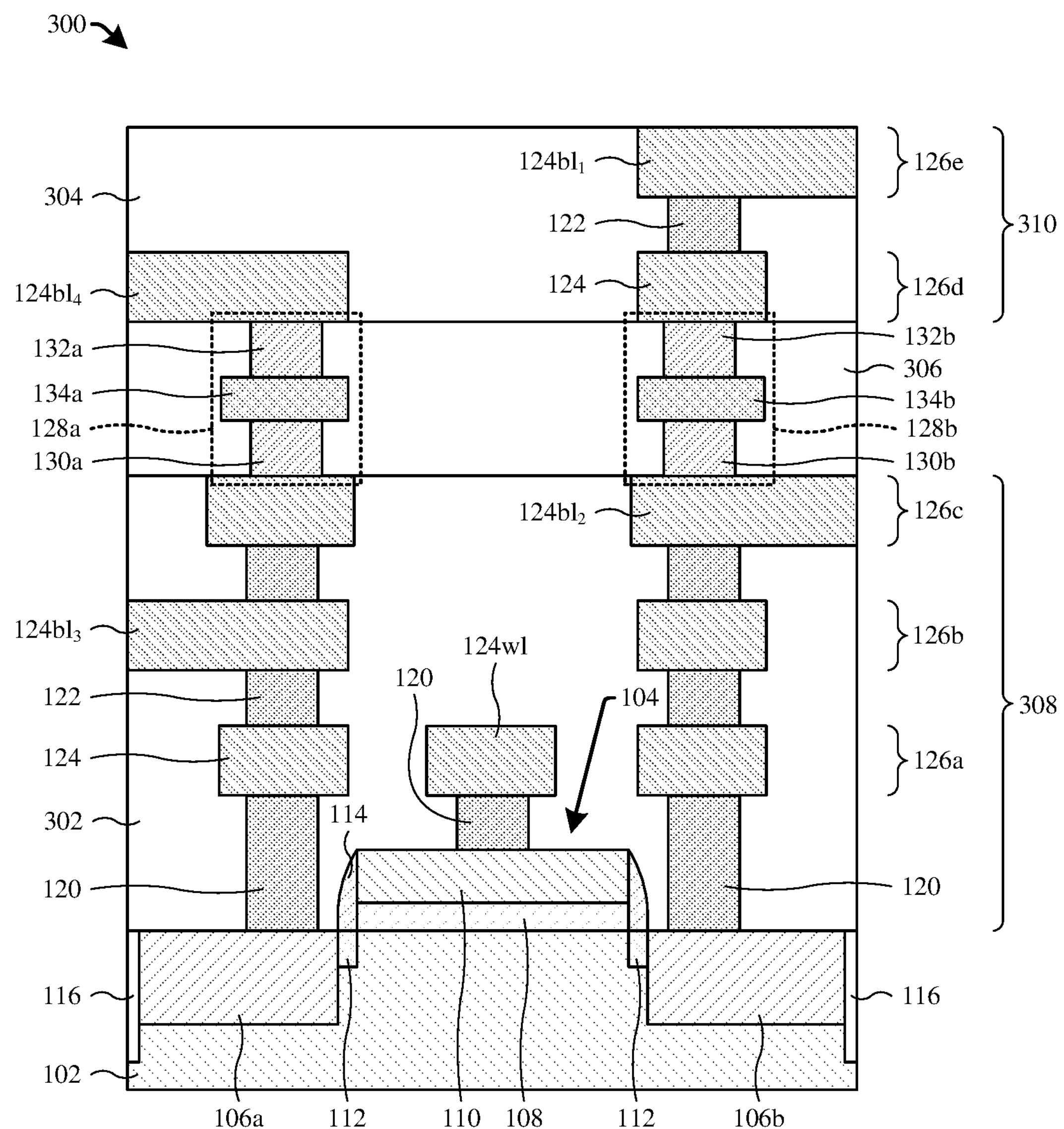
FIG. 3 illustrates a cross-sectional view of some other embodiments of the memory device of FIGS. 1A-1B.

FIG. 3 illustrates a cross-sectional view 300 of some other embodiments of the memory device of FIGS. 1A-1B.

As shown in the cross-sectional view 300 of FIG. 3, a lower ILD structure 302 is disposed over the substrate 102 and the semiconductor device 104. An upper ILD structure 304 is disposed over the lower ILD structure 302. A middle ILD structure 306 is disposed vertically between the upper ILD structure 304 and the lower ILD structure 302. The lower ILD structure 302, the middle ILD structure 306, and the upper ILD structure 304 may comprise one or more stacked ILD layers, which may respectively comprise a low-k dielectric (e.g., a dielectric material with a dielectric constant less than about 3.9), an oxide (e.g., $SiO_2$), or the like.

The plurality of conductive contacts 120; the conductive lines 124 of the first conductive layer 126*a*, the second conductive layer 126*b*, and the third conductive layer 126*c* are disposed within the lower ILD structure 302; the conductive vias 122 that extend between the first conductive layer 126*a* and the second conductive layer 126*b*; and the conductive vias 122 that extend between the second conductive layer 126*b* and the third conductive layer 126*c* are disposed within the lower ILD structure 302. In some embodiments, the plurality of conductive contacts 120; the conductive lines 124 of the first conductive layer 126*a*, the second conductive layer 126*b*, and the third conductive layer 126*c*; the conductive vias 122 that extend between the first conductive layer 126*a* and the second conductive layer 126*b*; and the conductive vias 122 that extend between the second conductive layer 126*b* and the third conductive layer 126*c* are referred to as a lower interconnect structure 308.

The conductive lines 124 of the fourth conductive layer 126*d*; the conductive lines 124 of the fifth conductive layer 126*e*; and the conductive vias 122 that extend between the fourth conductive layer 126*d* and the fifth conductive layer 126*e* are disposed in the upper ILD structure 304. In some embodiments, conductive lines 124 of the fourth conductive layer 126*d*; the conductive lines 124 of the fifth conductive layer 126*e*; and the conductive vias 122 that extend between the fourth conductive layer 126*d* and the fifth conductive layer 126*e* are referred to as an upper interconnect structure 310.

In some embodiments, each of the conductive lines 124 of each of the conductive layers 126 has an electrical resistance of about 0.5 ohms (Q). In further embodiments, each of the conductive vias 122 that extend between two corresponding conductive layers have an electrical resistance of about 0.5Ω. For example, the second electrode 132*b* of the second memory cell 128*b* is electrically coupled to the first bit line 124*bl*$_1$ via the third conductive path. In some embodiments, the third conductive path is defined by the second conductive line of the one or more conductive lines of the fourth conductive layer 126*d* and the fifth conductive via of the plurality of conductive vias 122. As such, the third conductive path has an electrical resistance of about 1Ω (e.g., the second conductive line of the one or more conductive lines of the fourth conductive layer 126*d* has a first electrical resistance of about 0.5Ω and the fifth conductive via of the plurality of conductive vias 122 has a second electrical resistance of about 0.5Ω).

The first memory cell 128*a* and the second memory cell 128*b* are disposed within the middle ILD structure 306. The middle ILD structure 306 laterally surrounds the first memory cell 128*a* and the second memory cell 128*b*. The first memory cell 128*a* and the second memory cell 128*b* are both disposed vertically between the lower interconnect structure 308 and the upper interconnect structure 310. In some embodiments, the first memory device 128*a* has an electrical resistance between about 1,000Ω and about 10,000Ω. In further embodiments, the second memory device 128*b* has an electrical resistance between about 1,000Ω and about 10,000Ω.

Figure 4:
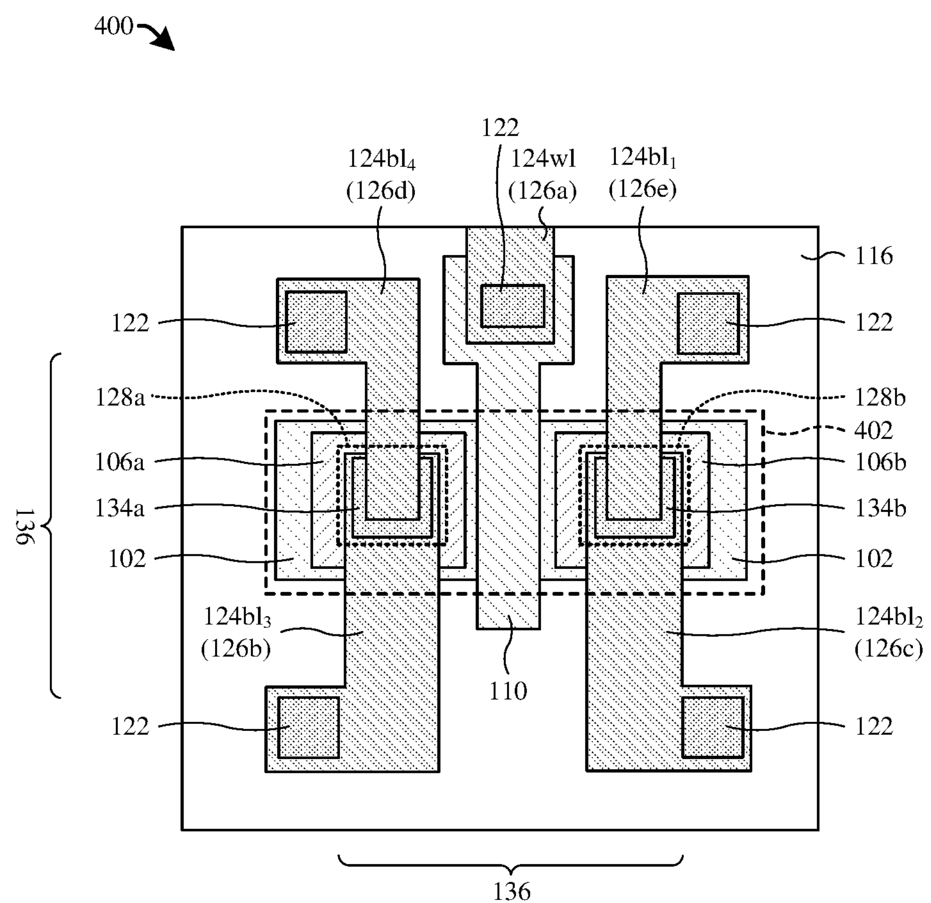
FIG. 4 illustrates a layout view of some other embodiments of the memory device of FIGS. 1A-1B.

FIG. 4 illustrates a layout view 400 of some other embodiments of the memory device of FIGS. 1A-1B.

As shown in the layout view 400 of FIG. 4, the word line 124*wl* is disposed in the first conductive layer 126*a*. The third bit line 124*bl*$_3$ is disposed in the second conductive layer 126*b*. The second bit line 124*bl*$_2$ is disposed in the third conductive layer 126*c*. The fourth bit line 124*bl*$_4$ is disposed in the fourth conductive layer 126*d*. The first bit line 124*bl*$_1$ is disposed in the fifth conductive layer 126*e*.

Also shown in the layout view 400 of FIG. 4, corresponding conductive vias of the plurality of conductive vias 122 extend (vertically) from the first bit line 124*bl*$_1$, the second bit line 124*bl*$_2$, the third bit line 124*bl*$_3$, the fourth bit line 124*bl*$_4$, and the word line 124*wl*. Each of the corresponding conductive vias of the plurality of conductive vias 122 extend vertically from a first corresponding conductive layer of the plurality of conductive layers 126*a-e* to a second corresponding conductive layer (not shown) of the plurality of conductive layers 126*a-e* that overlies the first corresponding conductive layer. For example, a first corresponding conductive via of the plurality of conductive vias 122 extends vertically from the third bit line 124*bl*$_3$ (which is in the second conductive layer 126*b*) to the first conductive line of the one or more conductive lines of the third conductive layer 126*c* (e.g., the third group of conductive lines of the plurality of conductive lines 124). It will be appreciated that, in some embodiments, a second corresponding conductive via of the plurality of conductive vias 122 extends vertically from the first bit line 124*bl*$_1$ (which is in the fifth conductive layer 126*e*) to a conductive line of the one or more conductive lines of a sixth conductive layer (not shown), which overlies the fifth conductive layer 126*e*.

In some embodiments, each of the corresponding conductive vias of the plurality of conductive vias 122 are disposed outside a perimeter of a device region 402 of the substrate 102. The first source/drain region 106*a* and the second source/drain region 106*b* of the semiconductor device 104 are disposed within the device region 402. In some embodiments, the device region 402 is defined by a region of the substrate 102 that is laterally surrounded in a closed loop path by the isolation structure 116.

Figure 5:
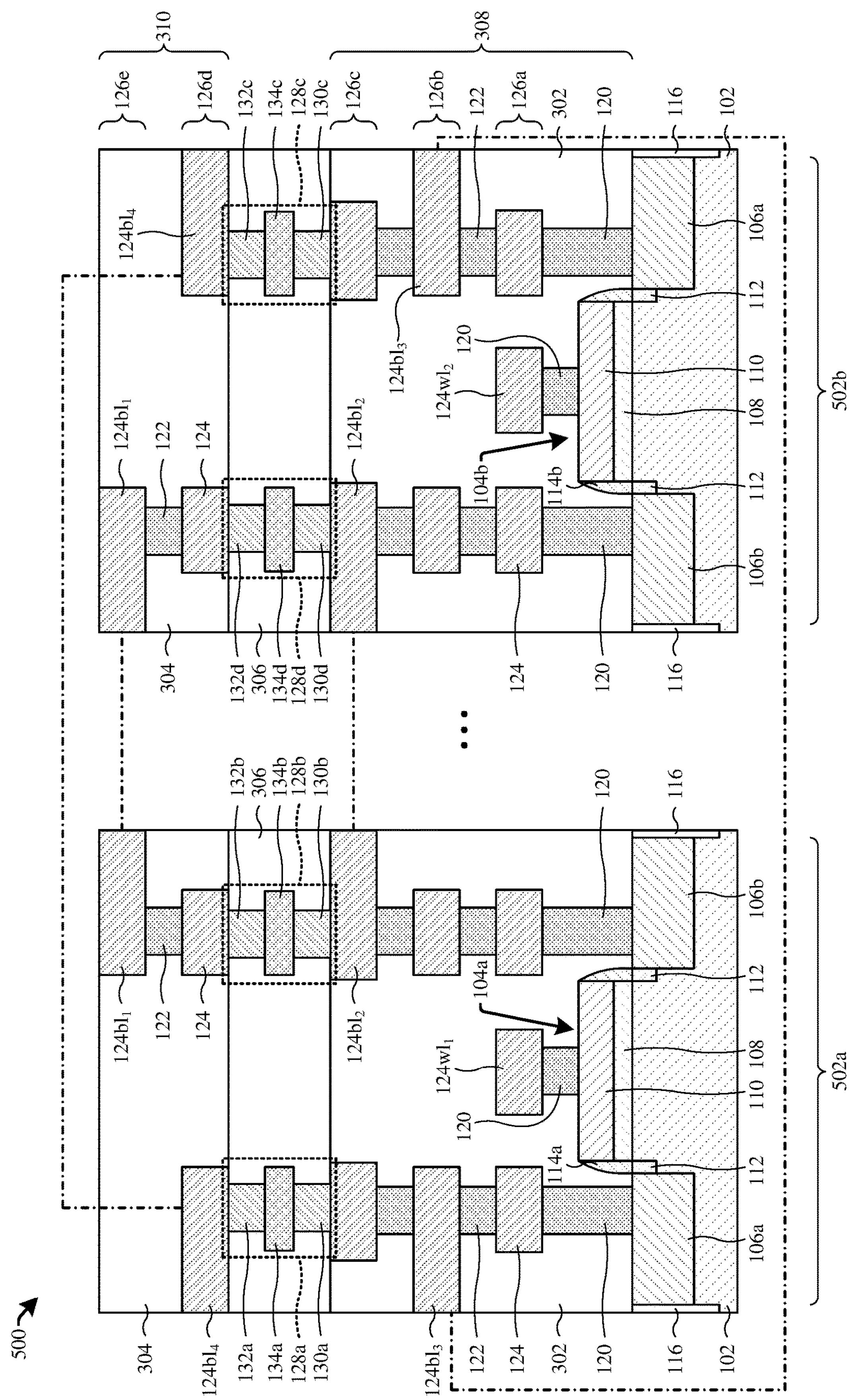
FIG. 5 illustrates a cross-sectional view of some other embodiments of the memory device of FIGS. 1A-1B.

FIG. 5 illustrates a cross-sectional view 500 of some other embodiments of the memory device of FIGS. 1A-1B.

As shown in the cross-sectional view 500 of FIG. 5, the memory device comprises a plurality of memory blocks 502*a-b*. For example, the plurality of memory blocks 502*a-b* comprises a first memory block 502*a* and a second memory block 502*b*. The first memory block 502*a* and the second memory block 502*b* are laterally spaced (illustrated by the ellipsis ( . . . ) of FIG. 5). The first memory block 502*a* comprises a first semiconductor device 104*a*, a first memory cell 128*a*, and a second memory cell 128*b*. The first memory cell 128*a* comprises a first electrode 130*a*, a second electrode 132*a*, and a data storage structure 134*a*. The second memory cell 128*b* comprises a first electrode 130*b*, a second electrode 132*b*, and a data storage structure 134*b*.

A first word line 124*wl*$_1$ is disposed in a lower ILD structure 302 and electrically coupled to a conductive gate electrode 110 of the first semiconductor device 104*a*. The first electrode 130*a* of the first memory cell 128*a* is electrically coupled to a first source/drain region 106*a* of the first semiconductor device 104*a* and to a third bit line 124$bl_3$. The second electrode 132*a* of the first memory cell 128*a* is electrically coupled to a fourth bit line 124$bl_4$. The first electrode 130*b* of the second memory cell 128*b* is electrically coupled to a second source/drain region 106*b* of the first semiconductor device 104*a* and to a second bit line 124$bl_2$. The second electrode 132*b* of the second memory cell 128*b* is electrically coupled to a first bit line 124$bl_1$.

The second memory block 502*b* comprises a second semiconductor device 104*b*, a third memory cell 128*c*, and a fourth memory cell 128*d*. The third memory cell 128*c* comprises a first electrode 130*c*, a second electrode 132*c*, and a data storage structure 134*c*. The fourth memory cell 128*d* comprises a first electrode 130*d*, a second electrode 132*d*, and a data storage structure 134*d*.

A second word line 124$wl_2$ is disposed in the lower ILD structure 302 and electrically coupled to a conductive gate electrode 110 of the second semiconductor device 104*b*. The first word line 124$wl_1$ is laterally spaced from the second word line 124$wl_2$. The first electrode 130*c* of the third memory cell 128*c* is electrically coupled to a first source/drain region 106*a* of the second semiconductor device 104*b* and to the third bit line 124$bl_3$ (the dashed lines of FIG. 5 illustrate that commonly labeled bit lines (e.g., the third bit line 124$bl_3$ labeled in both the first memory block 502*a* and the second memory block 502*b*) are electrically coupled together). A second electrode 132*c* of the third memory cell 128*c* is electrically coupled to the fourth bit line 124$bl_4$. A first electrode 130*d* of the fourth memory cell 128*d* is electrically coupled to a second source/drain region 106*b* of the second semiconductor device 104*b* and to the second bit line 124$bl_2$. A second electrode 132*d* of the fourth memory cell 128*d* is electrically coupled to the first bit line 124$bl_1$.

While the cross-sectional view 500 of FIG. 5 illustrates the memory device comprising two memory blocks (e.g., the first memory block 502*a* and the second memory block 502*b*), it will be appreciated that the memory device may comprise any number of memory blocks (e.g., 1, 2, 3, 4, etc.). In some embodiments, the memory blocks are coupled together in a memory array. For example, the memory device may comprise four memory blocks, each of which comprise two memory cells, coupled together in a memory array (e.g., an 8-bit memory array).

Also shown in the cross-sectional view 500 of FIG. 5, a plurality of sidewall spacers 114*a-b* are disposed over the substrate 102. For example, a first sidewall spacer 114*a* is disposed over the substrate 102, and a second sidewall spacer 114*b* is disposed over the substrate 102. The first sidewall spacer 114*a* is disposed along sidewalls of the conductive gate electrode 110 and the gate dielectric 108 of the first semiconductor device 104*a*. The second sidewall spacer 114*b* is disposed along sidewalls of the conductive gate electrode 110 and the gate dielectric 108 of the second semiconductor device 104*b*.

Figures 6A, 6B:
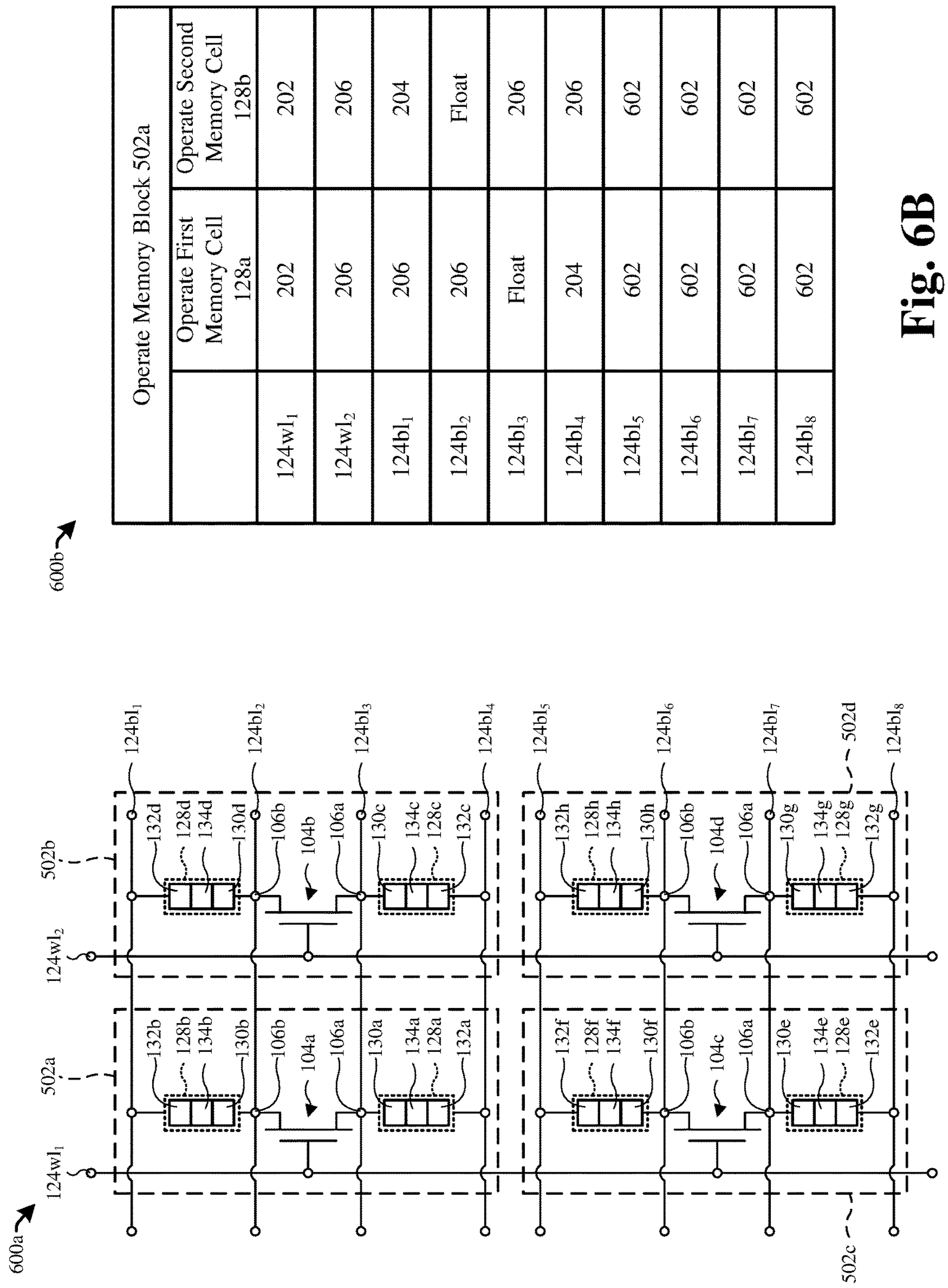
FIG. 6A illustrates a circuit diagram of an equivalent circuit of some embodiments of the memory device of FIGS. 1A-1B.
FIG. 6B illustrates a table of some embodiments of operating a first memory block of the equivalent circuit of the circuit diagram of FIG. 6A.

FIG. 6A illustrates a circuit diagram 600*a* of an equivalent circuit of some embodiments of the memory device of FIGS. 1A-1B. More specifically, the equivalent circuit of the circuit diagram 600*a* illustrates the memory device of FIGS. 1A-1B in which the memory device comprises an 8-bit memory array. FIG. 6B illustrates a table 600*b* of some embodiments of operating a first memory block 502*a* of the equivalent circuit of the circuit diagram 600*a* of FIG. 6A.

As shown in the circuit diagram 600*a* of FIG. 6A, the memory device comprise a plurality of memory blocks 502*a-d*. For example, the plurality of memory blocks 502*a-d* comprises a first memory block 502*a*, a second memory block 502*b*, a third memory block 502*c*, and a fourth memory block 502*d*. While the circuit diagram 600*a* of FIG. 6A illustrates the plurality of memory blocks 502*a-d* comprising four separate memory blocks, it will be appreciated that the plurality of memory blocks 502*a-d* may comprise any number of memory blocks.

The plurality of memory blocks 502*a-d* comprises a plurality of semiconductor devices 104*a-d*, respectively. Each of the plurality of memory blocks 502*a-d* also comprises two corresponding memory cells of a plurality of memory cells 128*a-h*. For example, the first memory block 502*a* comprises a first semiconductor device 104*a*, a first memory cell 128*a*, and a second memory cell 128*b*; the second memory block 502*b* comprises a second semiconductor device 104*b*, a third memory cell 128*c*, and a fourth memory cell 128*d*; the third memory block 502*c* comprises a third semiconductor device 104*c*, a fifth memory cell 128*e*, and a sixth memory cell 128*f*; and the fourth memory block 502*d* comprises a fourth semiconductor device 104*d*, a seventh memory cell 128*g*, and an eighth memory cell 128*h*.

The plurality of memory cells 128*a-h* comprise a plurality of first electrodes 130*a-h*, respectively. The plurality of memory cells 128*a-h* comprise a plurality of second electrodes 132*a-h*, respectively. The plurality of memory cells 128*a-h* comprise a plurality of data storage structures 134*a-h*, respectively. For example, the first memory cell 128*a* comprises a first electrode 130*a*, a second electrode 132*a*, and a data storage structure 134*a*; the second memory cell 128*b* comprises a first electrode 130*b*, a second electrode 132*b*, and a data storage structure 134*b*; the third memory cell 128*c* comprises a first electrode 130*c*, a second electrode 132*c*, and a data storage structure 134*c*; and so forth.

A plurality of word lines 124$wl_{1-2}$ are electrically coupled to the plurality of semiconductor devices 104*a-d*. More specifically, a first word line 124$wl_1$ is electrically coupled to a conductive gate electrode of the first semiconductor device 104*a* and a conductive gate electrode of the third semiconductor device 104*c*. A second word line 124$wl_2$ is electrically coupled to a conductive gate electrode of the second semiconductor device 104*b* and a conductive gate electrode of the fourth semiconductor device 104*d*.

A plurality of bit lines 124$bl_{1-8}$ are electrically coupled to the plurality of memory cells 128*a-h*. More specifically, a first bit line 124$bl_1$ is electrically coupled to the second electrode 132*b* of the second memory cell 128*b* and the second electrode 132*d* of the fourth memory cell 128*d*. A second bit line 124$bl_2$ is electrically coupled to the first electrode 130*b* of the second memory cell 128*b* and the first electrode 130*d* of the fourth memory cell 128*d*. A third bit line 124$bl_3$ is electrically coupled to the first electrode 130*a* of the first memory cell 128*a* and the first electrode 130*c* of the third memory cell 128*c*. A fourth bit line 124$bl_4$ is electrically coupled to the second electrode 132*a* of the first memory cell 128*a* and the second electrode 132*d* of the third memory cell 128*c*.

A fifth bit line 124$bl_5$ is electrically coupled to the second electrode 132*f* of the sixth memory cell 128*f* and the second electrode 132*h* of the eighth memory cell 128*h*. A sixth bit line 124$bl_6$ is electrically coupled to the first electrode 130*f* of the sixth memory cell 128*f* and the first electrode 130*h* of the eighth memory cell 128*h*. A seventh bit line 124$bl_7$ is electrically coupled to the first electrode 130*e* of the fifth memory cell 128*e* and the first electrode 130*g* of the seventh memory cell 128*g*. An eighth bit line 124$bl_8$ is electrically coupled to the second electrode 132_e_ of the fifth memory cell 128_e_ and the second electrode 132_g_ of the seventh memory cell 128_g_.

As shown in the table 600_b_ of FIG. 6B, specific voltages are applied to the plurality of bit lines 124$bl_{1-8}$ and the plurality of memory cells 128_a-h_ to operate the first memory block 502_a_ (e.g., write, erase, or read the first memory cell 128_a_ and/or the second memory cell 128_b_).

For example, to operate the first memory cell 128_a_ (e.g., write, erase, or read the first memory cell 128_a_), a first voltage 202 (see, FIGS. 2A-2B) is applied to the first word line 124$wl_1$, and a third voltage 206 (see, FIGS. 2A-2B) is applied to the second word line 124$wl_2$. Further, the third voltage 206 is also applied to the first bit line 124$bl_1$ and the second bit line 124$bl_2$. Moreover, a second voltage 204 (see, FIGS. 2A-2B) is applied to the fourth bit line 124$bl_4$, while the third bit line 124$bl_3$ is floating (e.g., not driven to a specific voltage).

In addition, a fourth voltage 602 is applied to the fifth bit line 124$bl_5$, the sixth bit line 124$bl_6$, the seventh bit line 124$bl_7$, and the eighth bit line 124$bl_8$. In some embodiments, the fourth voltage 602 is referred to as a standby voltage (e.g., $V_{STB}$). The plurality of semiconductor devices 104_a-d_ have a threshold voltage (e.g., $V_{TH}$). In some embodiments, the threshold voltage (e.g., $V_{TH}$) of the plurality of semiconductor devices 104_a-d_ is between about 0.2 volts (V) and about 0.7 V. The fourth voltage 602 is less than a difference between the first voltage 202 and the threshold voltage (e.g., $V_{TH}$) of the plurality of semiconductor devices 104_a-d_. For example, the first voltage 202 may be 4 V and the threshold voltage of the plurality of semiconductor devices 104_a-d_ may be 0.7 V. As such, the fourth voltage 602 is less than 3.3 V. In another example, the first voltage 202 may be 0.2 V and the threshold voltage of the plurality of semiconductor devices 104_a-d_ may be 0.2 V. As such, the fourth voltage 602 is less than 0 V.

It will be appreciated that applying a voltage to one of the plurality of bit lines 124$bl_{1-8}$ applies that voltage to each of the features of the plurality of memory cells 128_a-h_ that are electrically coupled to the one of the plurality of bit lines 124$bl_{1-8}$. For example, by applying the third voltage 206 to the first bit line 124$bl_1$, the third voltage 206 is applied to the second electrode 132_b_ of the second memory cell 128_b_ and to the second electrode 132_d_ of the fourth memory cell 128_d_. Likewise, it will also be appreciated that applying a voltage to one of the plurality of word lines 124$wl_{1-2}$ applies that voltage to each of the features of the plurality of semiconductor devices 104_a-d_ that are electrically coupled to the one of plurality of word lines 124$wl_{1-2}$. For example, by applying the first voltage 202 to the first word line 124_wl i_, the first voltage is applied to the conductive gate electrode (see, e.g., FIGS. 1-5) of the first semiconductor device 104_a_ and the conductive gate electrode of the third semiconductor device 104_c_.

By applying the third voltage 206 (e.g., ground) to the second word line 124$wl_2$, the second semiconductor device 104_b_ and the fourth semiconductor device 104_d_ are in an "OFF" state (e.g., a state in which the conductive channel does not exists between the first source/drain region 106_a_ and the second source/drain region 106_b_). In some embodiments, the second semiconductor device 104_b_ and the fourth semiconductor device 104_d_ are in an "OFF" state due to the third voltage 206 being below a threshold voltage (e.g., $V_{th}$) of the second semiconductor device 104_b_ and the fourth semiconductor device 104_d_ (e.g., the second semiconductor device 104_b_ and the fourth semiconductor device 104_d_ are operating in their "cut-off" regions). As such, the second memory block 502_b_ and the fourth memory block 502_d_ are in an "OFF" state (e.g., no current flow (not accounting for leakage current)).

By applying the first voltage 202 (e.g., between about 0.2 V and about 4 V) to the first word line 124$wl_1$, and by applying the fourth voltage 602 to the fifth bit line 124$bl_5$, the sixth bit line 124$bl_6$, the seventh bit line 124$bl_7$, and the eighth bit line 124$bl_8$, the third memory block 502_c_ is also in the "OFF" state (e.g., no current flow (not accounting for leakage current)). More specifically, the third memory block 502_c_ is in the "OFF" state due to the first voltage 202 minus the fourth voltage 602 being less than the threshold voltage of the third semiconductor device 104_c_. As such, the third semiconductor device 104_c_ is also in the "OFF" state.

By floating the third bit line 124$bl_3$, and by applying the first voltage 202 to the first word line 124_wl i_, the third voltage 206 to the first bit line 124$bl_1$, the third voltage 206 to the second bit line 124$bl_2$, and the second voltage 204 (e.g., between about −2 V and about 2V) to the fourth bit line 124$bl_4$, the first memory cell 128_a_ may be operated (e.g., write, erase, or read the first memory cell 128_a_). More specifically, by applying these voltages in the above described manner, the first semiconductor device 104_a_ is placed in an "ON" state. Further, a first current (see, $I_1$ of FIG. 2A) passes through the first memory cell 128_a_ from the second bit line 124$bl_2$ to the fourth bit line 124$bl_4$, thereby allowing the first memory cell 128_a_ to be operated. It will be appreciated that the specific magnitude and polarity of the second voltage 204 is dependent on the specific operation (e.g., SET, RESET, read) that is being performed on the first memory cell 128_a_ (see, FIG. 2A).

Also shown in the table 600_b_ of FIG. 6B, to operate the second memory cell 128_b_ (e.g., write, erase, or read the second memory cell 128_b_), the first voltage 202 is applied to the first word line 124$wl_1$; the third voltage 206 is applied to the second word line 124$wl_2$; the second voltage 204 is applied to the first bit line 124$bl_1$; the second bit line 124$bl_2$ is floated (e.g., electrically floating); the third voltage 206 is applied to the third bit line 124$bl_3$ and the fourth bit line 124$bl_4$; and the fourth voltage 602 is applied to the fifth bit line 124$bl_5$, the sixth bit line 124$bl_6$, the seventh bit line 124$bl_7$, and the eighth bit line 124$bl_8$. As such, the second memory block 502_b_, the third memory block 502_c_, and the fourth memory block 502_d_ are in the "OFF" state.

By floating the second bit line 124$bl_2$, and by applying the first voltage 202 to the first word line 124$wl_1$, the second voltage 204 to the first bit line 124$bl_1$, the third voltage 206 to the third bit line 124$bl_3$, and the third voltage 206 to the fourth bit line 124$bl_4$, the second memory cell 128_b_ may be operated (e.g., write, erase, or read the second memory cell 128_b_). More specifically, by applying these voltages in the above described manner, the first semiconductor device 104_a_ is placed in an "ON" state. Further, a second current (see, $I_2$ of FIG. 2B) passes through the second memory cell 128_b_ from the third bit line 124$bl_3$ to the first bit line 124$bl_1$, thereby allowing the second memory cell 128_b_ to be operated. It will be appreciated that the specific magnitude and polarity of the second voltage 204 is dependent on the specific operation (e.g., SET, RESET, read) that is being performed on the second memory cell 128_b_ (see, FIG. 2B).

It will be appreciated that the second memory block 502_b_, the third memory block 502_c_, and the fourth memory block 502_d_ are operated in a substantially similar manner as the first memory block 502_a_. It will further be appreciated that when operating one of the plurality of memory blocks 502_a-d_ each of the other ones of the plurality of memory blocks 502_a-d_ are to be in the "OFF" state. For example, when operating the second memory block 502*b*, the first memory block 502*a*, the third memory block 502*c*, and the fourth memory block are placed in the "OFF" state.

As discussed above, the memory device of the present application may have a greater cell density (e.g., number of memory cells per unit area) than a typical memory device. In addition, the memory device of the present application may reduce or eliminate block-to-block crosstalk (e.g., cross-talk between the plurality of memory blocks 502*a-d*). The memory device of the present application reduces (or eliminates) block-to-block crosstalk due to the manner in which the plurality of memory blocks 502*a-d* are operated. More specifically, the memory device of the present application may reduce (or eliminate) block-to-block crosstalk by operating one of the plurality of memory blocks 502*a-d* while each of the other ones of the plurality of memory blocks 502*a-d* are in the OFF state.

Figure 7:
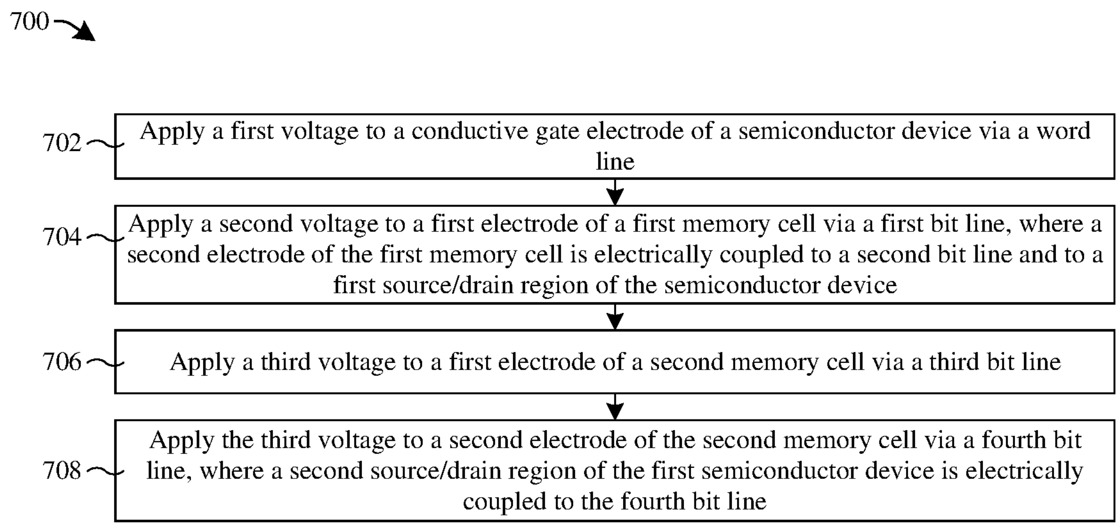
FIG. 7 illustrates a flowchart of some embodiments of a method for operating a memory block of some embodiments of the memory device of FIGS. 1A-1B.

FIG. 7 illustrates a flowchart 700 of some embodiments of a method for operating a memory block of some embodiments of the memory device of FIGS. 1A-1B. While the flowchart 700 of FIG. 7 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 702, a first voltage is applied to a conductive gate electrode of a semiconductor device via a word line (see, e.g., FIG. 2A and FIGS. 6A-6B).

At act 704, a second voltage is applied to a first electrode of a first memory cell via a first bit line, where a second electrode of the first memory cell is electrically coupled to a second bit line and to a first source/drain region of the semiconductor device (see, e.g., FIG. 2A and FIGS. 6A-6B).

At act 706, a third voltage is applied to a first electrode of a second memory cell via a third bit line (see, e.g., FIG. 2A and FIGS. 6A-6B).

At act 708, the third voltage is applied to a second electrode of the second memory cell via a fourth bit line, where a second source/drain region of the first semiconductor device is electrically coupled to the fourth bit line (see, e.g., FIG. 2A and FIGS. 6A-6B).

Figure 8:
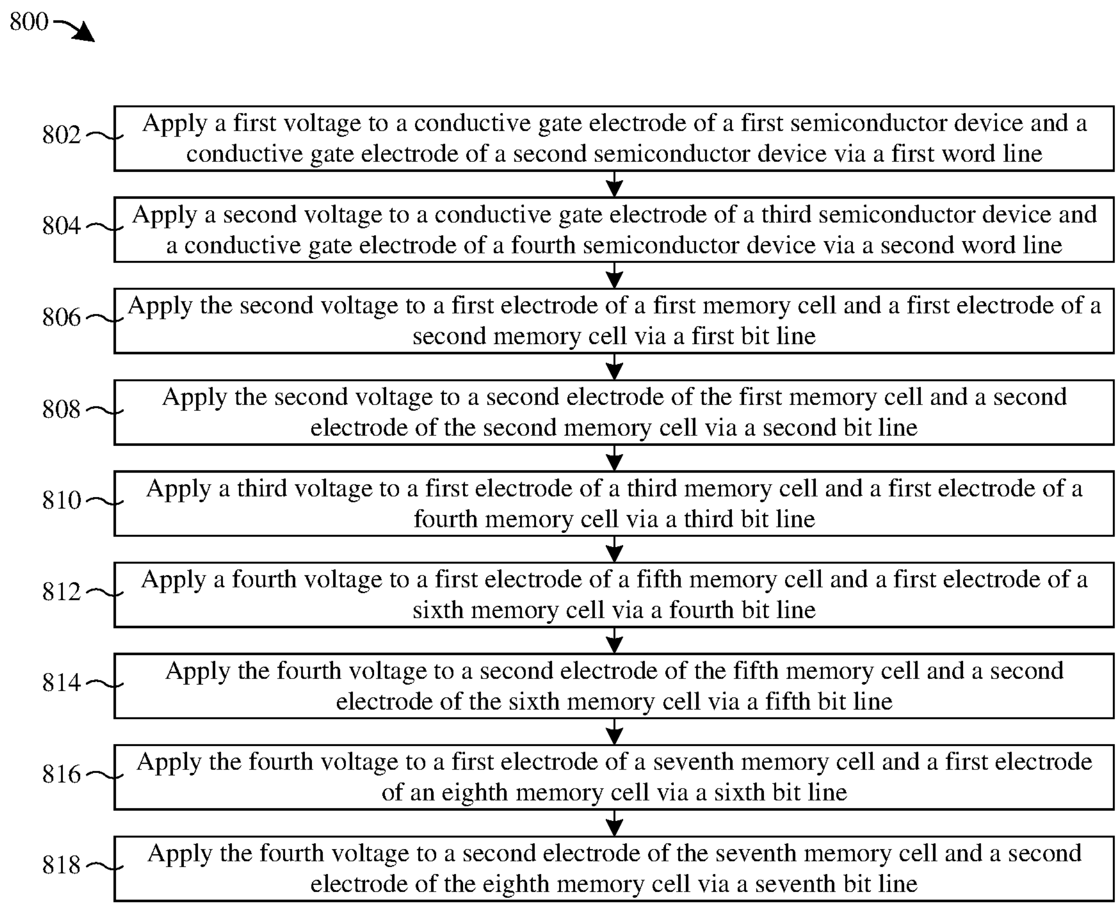
FIG. 8 illustrates a flowchart of some embodiments of a method for operating a memory block of some embodiments of the memory device of FIGS. 1A-1B, where the memory block is one memory block of a plurality of memory blocks.

FIG. 8 illustrates a flowchart 800 of some embodiments of a method for operating a memory block of some embodiments of the memory device of FIGS. 1A-1B, where the memory block is one memory block of a plurality of memory blocks. While the flowchart 800 of FIG. 8 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 802, a first voltage is applied to a conductive gate electrode of a first semiconductor device and a conductive gate electrode of a second semiconductor device via a first word line (see, e.g., FIGS. 6A-6B).

At act 804, a second voltage is applied to a conductive gate electrode of a third semiconductor device and a conductive gate electrode of a fourth semiconductor device via a second word line (see, e.g., FIGS. 6A-6B).

At act 806, the second voltage is applied to a first electrode of a first memory cell and a first electrode of a second memory cell via a first bit line (see, e.g., FIGS. 6A-6B).

At act 808, the second voltage is applied to a second electrode of the first memory cell and a second electrode of the second memory cell via a second bit line (see, e.g., FIGS. 6A-6B).

At act 810, a third voltage is applied to a first electrode of a third memory cell and a first electrode of a fourth memory cell via a third bit line (see, e.g., FIGS. 6A-6B).

At act 812, a fourth voltage is applied to a first electrode of a fifth memory cell and a first electrode of a sixth memory cell via a fourth bit line (see, e.g., FIGS. 6A-6B).

At act 814, the fourth voltage is applied to a second electrode of the fifth memory cell and a second electrode of the sixth memory cell via a fifth bit line (see, e.g., FIGS. 6A-6B).

At act 816, the fourth voltage is applied to a first electrode of a seventh memory cell and a first electrode of an eighth memory cell via a sixth bit line (see, e.g., FIGS. 6A-6B).

At act 818, the fourth voltage is applied to a second electrode of the seventh memory cell and a second electrode of the eighth memory cell via a seventh bit line (see, e.g., FIGS. 6A-6B).

FIGS. 9-12 illustrate a series of cross-sectional views 900-1200 of some embodiments of a method for forming a memory device that has increased memory cell density and reduced crosstalk. Although FIGS. 9-12 are described with reference to a method, it will be appreciated that the structures shown in FIGS. 9-12 are not limited to the method but rather may stand alone separate of the method.

Figure 9:
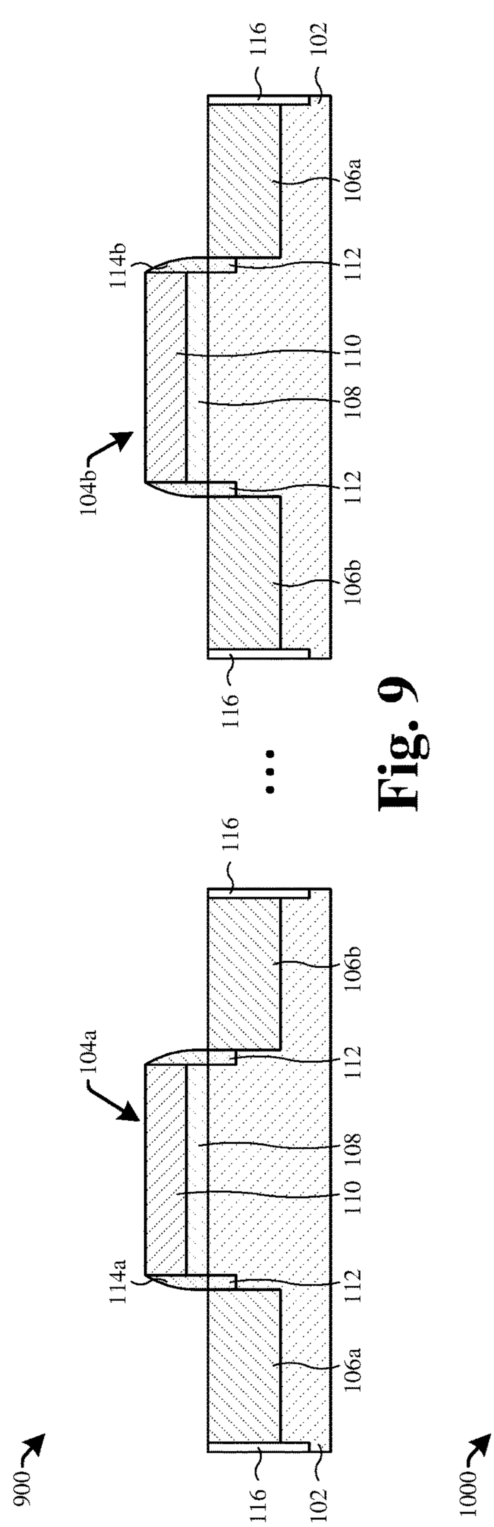
FIGS. 9-12 illustrate a series of cross-sectional views of some embodiments of a method for forming a memory device that has increased memory cell density and reduced crosstalk.

As shown in the cross-sectional view 900 of FIG. 9, an isolation structure 116 is formed in the substrate 102. In some embodiments, a process for forming the isolation structure 116 comprises selectively etching the substrate 102 to form a trench in the substrate 102. The substrate 102 may be selectively etched by forming a patterned masking layer (not shown) (e.g., positive/negative photoresist, a hardmask, etc.) over the substrate 102. The patterned masking layer may be formed by forming a masking layer (not shown) on an upper surface of the substrate 102 (e.g., via a spin-on process), exposing the masking layer to a pattern (e.g., via a lithography process, such as photolithography, extreme ultraviolet lithography, or the like), and developing the masking layer to form the patterned masking layer. Thereafter, with the patterned masking layer in place, an etching process is performed on the substrate 102 according to the first patterned masking layer. The etching process removes unmasked portions of the substrate 102, thereby forming the trench in the substrate 102. In some embodiments, the etching process may be, for example, a wet etching process, a dry etching process, a reactive ion etching (RIE) process, some other etching process, or a combination of the foregoing.

Thereafter, the trench is filled with a dielectric material. The dielectric material may be or comprise, for example, an oxide (e.g., $SiO_2$), a nitride (e.g., SiN), an oxy-nitride (e.g., SiON), a carbide (e.g., SiC), some other dielectric material, or a combination of the foregoing. In some embodiments, a process for filing the trench with the dielectric material comprises depositing or growing the dielectric material on the substrate 102 and in the trench. The dielectric material may be deposited or grown by, for example, chemical vapor deposition (CVD), physical vapor deposition (PVD), atomic layer deposition (ALD), thermal oxidation, some other deposition or growth process, or a combination of the foregoing. In some embodiments, a planarization process (e.g., chemical mechanical polishing (CMP)) may be performed on the dielectric material to remove an upper portion of the dielectric material, thereby leaving a lower portion of the dielectric material in the trench as the isolation structure 116.

Also shown in the cross-sectional view 900 of FIG. 9, a plurality of semiconductor devices 104*a-b* are formed in/over the substrate 102. For example, a first semiconductor device 104*a* and a second semiconductor device 104*b* are formed in the substrate 102. The first semiconductor device 104*a* and the second semiconductor device 104*b* each comprise a first source/drain region 106*a*, a second source/drain region 106*b*, a pair of lightly-doped source/drain extensions 112, a gate dielectric 108, and a conductive gate electrode 110.

In some embodiments, a process for forming the plurality of semiconductor devices 104*a-b* comprises depositing and/or growing (e.g., by CVD, PVD, ALD, thermal oxidation, etc.) a gate dielectric layer on the substrate 102. Next, a gate electrode layer is deposited (e.g., by CVD, PVD, ALD, sputtering, electrochemical plating, electroless plating, etc.) on the gate dielectric layer. Thereafter, the gate electrode layer is selectively etched to form the conductive gate electrode 110 of the first semiconductor device 104*a* and the conductive gate electrode 110 of the second semiconductor device 104*b*, and the gate dielectric layer is selectively etched to form the gate dielectric 108 of the first semiconductor device 104*a* and the gate dielectric 108 of the second semiconductor device 104*b*. In some embodiments, the gate electrode layer may comprise, for example, polysilicon, a metal (e.g., Al, Cu, Ti, Ta, W, Mo, Co, etc.). In further embodiments, the gate dielectric layer may comprise, for example, an oxide (e.g., $SiO_2$), a high-k dielectric (e.g., HfO, TaO, HfSiO, HfTaO, AlO, ZrO, etc.), or the like.

Thereafter, the pair of lightly-doped source/drain extensions 112 of the first semiconductor device 104*a* and the pair of lightly-doped source/drain extensions 112 of the second semiconductor device 104*b* are formed in the substrate 102. In some embodiments, the pair of lightly-doped source/drain extensions 112 of the first semiconductor device 104*a* and the pair of lightly-doped source/drain extensions 112 of the second semiconductor device 104*b* may be formed by a first selective implantation process (e.g., ion implantation, diffusion, etc.) that utilizes a first masking layer (not shown) disposed over the substrate 102 to selectively implant first doping type dopants (e.g., n-type dopants, such as phosphorus, arsenic, antimony, etc.) into the substrate 102. It will be appreciated that, in some embodiments, the conductive gate electrode 110 of the first semiconductor device 104*a*, the conductive gate electrode 110 of the second semiconductor device 104*b*, and/or the isolation structure 116 are utilized as the first masking layer.

Thereafter, a plurality of sidewall spacers 114*a-b* are formed over the substrate 102. For example, a first sidewall spacer 114*a* and a second sidewall spacer 114*b* are formed over the substrate 102. The first sidewall spacer 114*a* is also formed along sidewalls of the conductive gate electrode 110 and the gate dielectric 108 of the first semiconductor device 104*a*. The second sidewall spacer 114*b* is also formed along sidewalls of the conductive gate electrode 110 and the gate dielectric 108 of the second semiconductor device 104*b*.

In some embodiments, a process for forming the plurality of sidewall spacers 114*a-b* comprises depositing a sidewall spacer layer (not shown) over the substrate 102, over the conductive gate electrode 110 of the first semiconductor device 104*a*, and over the conductive gate electrode 110 of the second semiconductor device 104*b*. Thereafter, horizontal portions of the spacer layer are etched away, thereby leaving vertical portions of the spacer layer in place as the plurality of sidewall spacers 114*a-b*. In some embodiments, the sidewall spacer layer may be or comprise, for example, an oxide (e.g., $SiO_2$), a nitride (e.g., silicon nitride (e.g., SiN)), an oxy-nitride (e.g., silicon oxy-nitride ($SiO_XN_Y$)), some other dielectric material, or a combination of the foregoing.

Thereafter, the pair of source/drain regions 106*a-b* of the first semiconductor device 104*a* and the pair of source/drain regions 106*a-b* of the second semiconductor device 104*b* are formed in the substrate 102. In some embodiments, the pair of source/drain regions 106*a-b* of the first semiconductor device 104*a* and the pair of source/drain regions 106*a-b* of the second semiconductor device 104*b* may be formed by a second selective implantation process (e.g., ion implantation, diffusion, etc.) that utilizes a second masking layer (not shown) disposed over the substrate 102 to selectively implant first doping type dopants (e.g., n-type dopants, such as phosphorus, arsenic, antimony, etc.) into the substrate 102. It will be appreciated that, in some embodiments, the plurality of sidewall spacers 114*a-b*, the conductive gate electrode 110 of the first semiconductor device 104*a*, the conductive gate electrode 110 of the second semiconductor device 104*b*, and/or the isolation structure 116 are utilized as the second masking layer.

Figure 10:
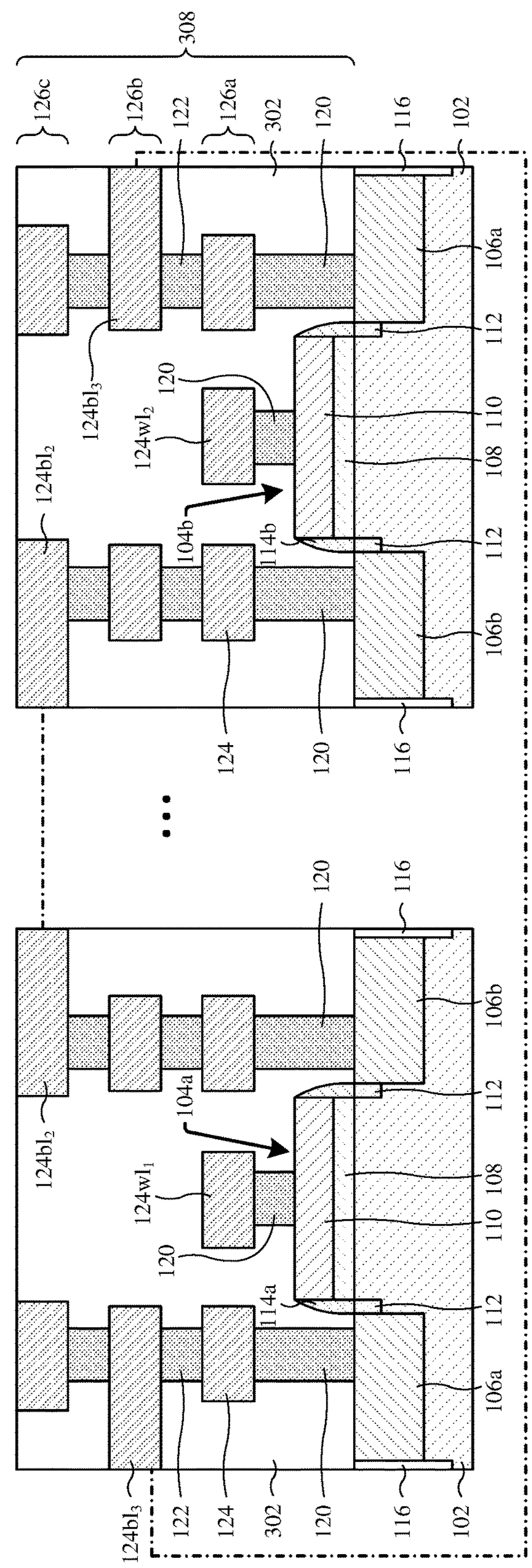

As shown in cross-sectional view 1000 of FIG. 10, a lower interlayer dielectric (ILD) structure 302 is formed over the substrate 102 and the plurality of semiconductor device 104*a-b*. The lower ILD structure 302 comprise one or more stacked ILD layers. Also shown in the cross-sectional view 1000 of FIG. 10, a lower interconnect structure 308 is formed in the lower ILD structure 302. The lower interconnect structure 308 comprises a plurality of conductive contacts 120, some of a plurality of conductive lines 124, and some of a plurality of conductive vias 122. More specifically, the lower interconnect structure 308 comprises the plurality of conductive contacts 120; the conductive lines 124 of a first conductive layer 126*a*, a second conductive layer 126*b*, and a third conductive layer 126*c*; the conductive vias 122 that extend between the first conductive layer 126*a* and the second conductive layer 126*b*; and the conductive vias 122 that extend between the second conductive layer 126*b* and the third conductive layer 126*c*.

The lower interconnect structure 308 is formed with a first set of conductive features (e.g., the plurality of conductive contacts 120, the plurality of conductive lines 124, and the plurality of conductive vias 122) that are electrically coupled together and define a first conductive path. The first conductive path is electrically coupled to the first source/drain region 106*a* of the first semiconductor device 104*a*. The lower interconnect structure 308 is formed with a second set of conductive features that are electrically coupled together and define a second conductive path. The second conductive path is electrically coupled to the second source/drain region 106*b* of the first semiconductor device 104*a*. The first conductive path is different than the second conductive path.

The lower interconnect structure 308 is formed with a third set of conductive features that are electrically coupled together and define a fifth conductive path. The fifth conductive path is electrically coupled to the first source/drain region 106*a* of the second semiconductor device 104*b*. The lower interconnect structure 308 is formed with a fourth set of conductive features that are electrically coupled together and define a sixth conductive path. The sixth conductive path is electrically coupled to the second source/drain region 106*b* of the second semiconductor device 104*b*. The fifth conductive path is different than the sixth conductive path. In some embodiments, the first conductive path and the fifth conductive path are electrically coupled together (e.g., via the third bit line 124*bl*$_3$). In further embodiments, the second conductive path and the sixth conductive path are electrically coupled together (e.g., via the second bit line 124*bl*$_2$).

In some embodiments, a process for forming the lower ILD structure 302 and the lower interconnect structure 308 comprises forming a first ILD layer over the substrate 102 and over the plurality of semiconductor devices 104*a-b*. Thereafter, contact openings are formed in the first ILD layer. A conductive material (e.g., tungsten (W)) is then formed on the first ILD layer and in the contact openings. Thereafter, a planarization process (e.g., CMP) is performed on the conductive material to form the plurality of conductive contacts 120 in the first ILD layer. A second ILD layer is then formed over the first ILD layer and the plurality of conductive contacts 120. A plurality of trenches are then formed in the second ILD layer. A conductive material (e.g., copper (Cu)) is formed on the second ILD layer and in the trenches. Thereafter, a planarization process (e.g., CMP) is performed into the conductive material to form the conductive lines 124 of the first conductive layer 126*a*.

Thereafter, the conductive vias 122 and the remaining conductive lines 124 of the lower interconnect structure 308 may be formed by repeating a damascene process (e.g., a single damascene process or a dual damascene process) until each of the conductive lines 124 of the second conductive layer 126*b*; the conductive lines 124 of the third conductive layer 126*c*; the conductive vias 122 that extend between the first conductive layer 126*a* and the second conductive layer 126*b*; and the conductive vias 122 that extend between the second conductive layer 126*b* and the third conductive layer 126*c* are formed in the lower ILD structure 302.

The damascene process is performed by depositing a subsequent ILD layer over the second ILD layer and the conductive lines 124 of the first conductive layer 126*a*, etching the subsequent ILD layer to form one or more via holes and/or one or more trenches in the subsequent ILD layer, and filling the one or more via holes and/or the one or more trenches with a conductive material (e.g., copper (Cu)). Thereafter, a planarization process (e.g., CMP) is performed on the conductive material, thereby forming the conductive lines 124 of the second conductive layer 126*b* and/or the conductive vias 122 that extend between the first conductive layer 126*a* and the second conductive layer 126*b*. This damascene process is repeated until each of the conductive lines 124 and conductive vias 122 of the lower interconnect structure 308 are formed in the lower ILD structure 302. The ILD layers may be formed by, for example, CVD, PVD, ALD, some other deposition process, or a combination of the foregoing. The conductive material(s) (e.g., tungsten (W), copper (Cu), etc.) may be formed using a deposition process (e.g., CVD, PVD, sputtering, etc.) and/or a plating process (e.g., electrochemical plating, electroless plating, etc.).

Figure 11:
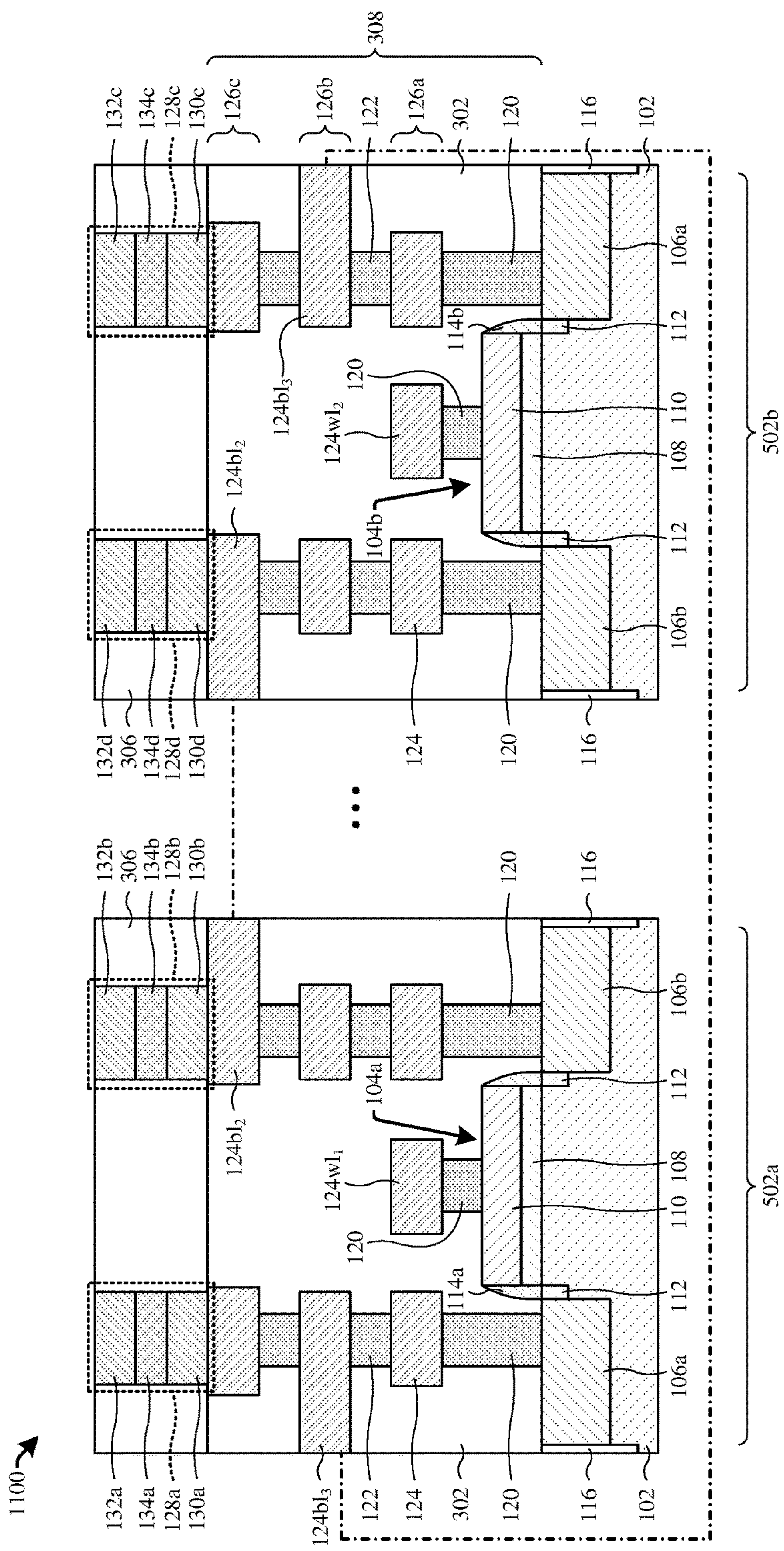

As shown in cross-sectional view 1100 of FIG. 11, a plurality of memory cells 128*a-d* are formed over the lower ILD structure 302 and the lower interconnect structure 308. For example, a first memory cell 128*a*, a second memory cell 128*b*, a third memory cell 128*c*, and a fourth memory cell 128*d* are formed over the lower ILD structure 302 and the lower interconnect structure 308. The plurality of memory cells 128*a-d* comprise a plurality of first electrodes 130*a-d*, respectively. The plurality of memory cells 128*a-d* comprise a plurality of second electrodes 132*a-d*, respectively. The plurality of memory cells 128*a-d* comprise a plurality of data storage structures 134*a-d*, respectively.

The first memory cell 128*a* is formed so that the first electrode 130*a* of the first memory cell 128*a* is electrically coupled to the first conductive path of the lower interconnect structure 308. The second memory cell 128*b* is formed so that the first electrode 130*b* of the second memory cell 128*b* is electrically coupled to the second conductive path of the lower interconnect structure 308. The third memory cell 128*c* is formed so that the first electrode 130*c* of the third memory cell 128*c* is electrically coupled to the fifth conductive path of the lower interconnect structure 308. The fourth memory cell 128*d* is formed so that the first electrode 130*d* of the fourth memory cell 128*d* is electrically coupled to the sixth conductive path of the lower interconnect structure 308.

In some embodiments, a process for forming the plurality of memory cells 128*a-d* comprises depositing a first electrode layer on the lower ILD structure 302 and the conductive lines 124 of the third conductive layer 126*c*. A data storage layer is then formed on the first electrode layer. A second electrode layer is then formed on the data storage layer. In some embodiments, the first electrode layer, the data storage layer, and the second electrode layer may be deposited or grown by, for example, CVD, PVD, ALD, sputtering, electrochemical plating, electroless plating, or some other deposition process. Thereafter, the second electrode layer, the data storage layer, and the first electrode layer are selectively etched to form the plurality of first electrodes 130*a-d*, the plurality of data storage structures 134*a-d*, and the plurality of second electrodes 132*a-d*. It will be appreciated that, in some embodiments, multiple etching process may be performed to form the plurality of memory cells 128*a-d*.

In some embodiments, the first electrode layer and the second electrode layer may be or comprise, for example, a metal (e.g., aluminum (Al), titanium (Ti), tantalum (Ta), gold (Au), platinum (Pt), tungsten (W), nickel (Ni), iridium (Ir), etc.), a metal-nitride (e.g., titanium nitride (TiN), tantalum nitride (TaN), etc.), a metal-oxide (e.g., iridium oxide ($rO_2$)), doped polysilicon (e.g., n-type/p-type polysilicon), or the like. In some embodiments, the data storage layer is or comprises, for example, a chalcogenide (e.g., germanium-antimony-tellurium (GST)), a ferroelectric crystal material (e.g., lead zirconate titanate (PZT)), a metal-oxide (e.g., hafnium oxide ($Hf_XO_Y$), zirconium-oxide ($Hf_XZr_YO_Z$), etc.), a component-metal-oxide (e.g., hafnium-silicon-oxide ($Hf_XSi_YO_Z$), hafnium-aluminum-oxide ($HfXAl_YO_Z$), strontium titanate (STO), etc.), a metal-oxynitride (e.g., hafnium oxynitride ($Hf_XO_YN_Z$)), or some other material that may selectively change between a high resistive state and a low resistive state. In further embodiments, the data storage layer may comprise multiple layers configured to store data based on a resistive state of one or more of the multiple layers. For example, the data storage layer may comprise a first ferromagnetic layer (e.g., iron, cobalt, etc.) separated from a second ferromagnetic layer (e.g., iron, cobalt, etc.) by an insulating layer (e.g., germanium oxide, magnesium oxide, aluminum oxide, etc.) that are patterned into a magnetic tunnel junction (MTJ).

Also shown in the cross-sectional view 1100 of FIG. 11, a middle ILD structure 306 is formed over the lower ILD structure 302 and laterally surrounding the plurality of memory cells 128*a-d*. In some embodiments, the middle ILD structure 306 is formed with an upper surface that is substantially co-planar with upper surfaces of the plurality of second electrodes 132*a-d*. In further embodiments, a process for forming the middle ILD structure 306 comprises depositing an ILD layer on the lower ILD structure 302 and over the plurality of memory cells 128*a-d*. The ILD layer may be deposited by, for example, CVD, PVD, ALD, sputtering, a spin-on process, some other deposition process, or a combination of the foregoing. Thereafter, a planarization process (e.g., CMP) is performed on the ILD layer to remove an upper portion of the ILD layer, thereby forming the middle ILD structure 306 and exposing the plurality of second electrodes 132*a-d*. In some embodiments, the planarization process may also remove upper portions of the plurality of second electrodes 132*a-d*.

Figure 12:
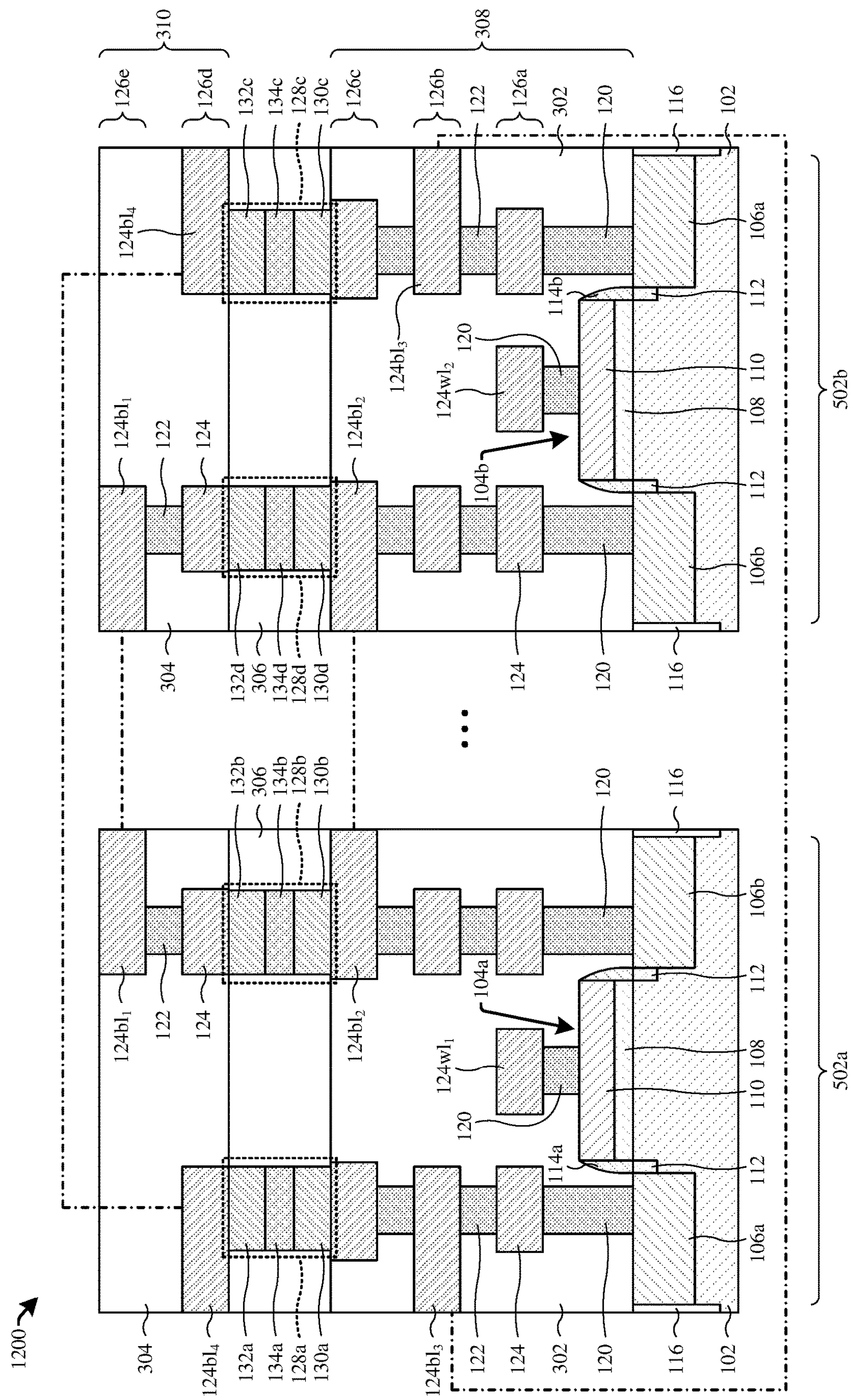

As shown in the cross-sectional view 1200 of FIG. 12, an upper ILD structure 304 is formed over the middle ILD structure 306 and the plurality of memory cells 128*a-d*. The upper ILD structure 304 comprise one or more stacked ILD layers. Also shown in the cross-sectional view 1200 of FIG. 12, an upper interconnect structure 310 is formed in the upper ILD structure 304. The upper interconnect structure 310 comprises some other of the plurality of conductive lines 124 and some other of the plurality of conductive vias 122. More specifically, the upper interconnect structure 310 comprises the conductive lines 124 of a fourth conductive layer 126*d*; the conductive lines 124 of a fifth conductive layer 126*e*; and the conductive vias 122 that extend between the fourth conductive layer 126*d* and the fifth conductive layer 126*e*. In some embodiments, the upper ILD structure 304 and the upper interconnect structure 310 are formed in a substantially similar manner as the lower ILD structure 302 and the lower interconnect structure 308 (see, e.g., FIG. 10). Although not shown, it will be appreciated that additional conductive lines 124 and/or additional conductive vias 122 may be formed over the conductive lines 124 of the fifth conductive layer 126*e* and in the upper ILD structure 304.

The upper interconnect structure 310 is formed with a fifth set of conductive features that are electrically coupled together and define a seventh conductive path. The seventh conductive path is electrically coupled to the second electrode 132*a* of the first memory cell 128*a*. The upper interconnect structure 310 is formed with a sixth set of conductive features that are electrically coupled together and define a third conductive path. The third conductive path is electrically coupled to the second electrode 132*b* of the second memory cell 128*b*. The seventh conductive path is different than the third conductive path.

The upper interconnect structure 310 is formed with a seventh set of conductive features that are electrically coupled together and define an eighth conductive path. The eighth conductive path is electrically coupled to the second electrode 132*c* of the third memory cell 128*c*. The upper interconnect structure 310 is formed with an eighth set of conductive features that are electrically coupled together and define a ninth conductive path. The ninth conductive path is electrically coupled to the second electrode 132*d* of the fourth memory cell 128*d*. The eighth conductive path is different than the ninth conductive path.

In some embodiments, the seventh conductive path and the eighth conductive path are electrically coupled together (e.g., via the fourth bit line 124$bl_4$). In some embodiments, the seventh conductive path and the eighth conductive path are the same (e.g., are the fourth bit line 124$bl_4$). In further embodiments, the third conductive path and the ninth conductive path are electrically coupled together (e.g., via the first bit line 124$bl_1$).

Figure 13:
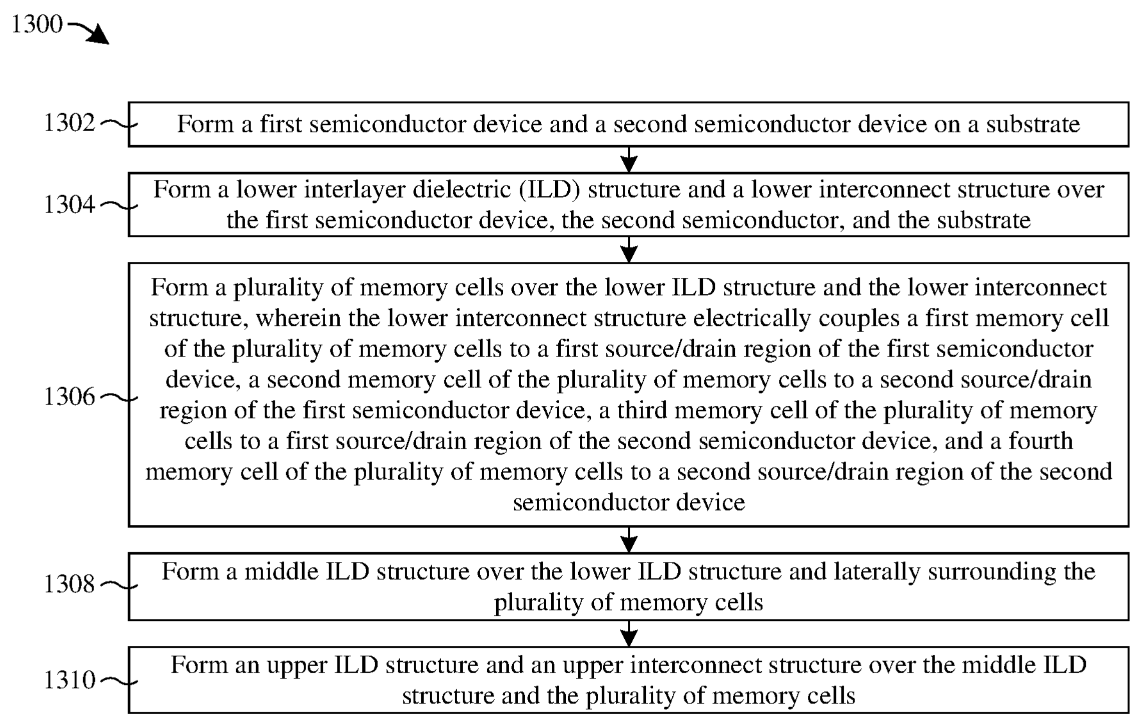
FIG. 13 illustrates a flowchart of some embodiments of a method for forming a memory device that has increased memory cell density and reduced crosstalk.

FIG. 13 illustrates a flowchart 1300 of some embodiments of a method for forming a memory device that has increased memory cell density and reduced crosstalk. While the flowchart 1300 of FIG. 13 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 1302, a first semiconductor device and a second semiconductor device are formed on a substrate. FIG. 9 illustrates a cross-sectional view 900 of some embodiments corresponding to act 1302.

At act 1304, a lower interlayer dielectric (ILD) structure and a lower interconnect structure are formed over the first semiconductor device, the second semiconductor, and the substrate. FIG. 10 illustrates a cross-sectional view 1000 of some embodiments corresponding to act 1304.

At act 1306, a plurality of memory cells are formed over the lower ILD structure and the lower interconnect structure, wherein the lower interconnect structure electrically couples a first memory cell of the plurality of memory cells to a first source/drain region of the first semiconductor device, a second memory cell of the plurality of memory cells to a second source/drain region of the first semiconductor device, a third memory cell of the plurality of memory cells to a first source/drain region of the second semiconductor device, and a fourth memory cell of the plurality of memory cells to a second source/drain region of the second semiconductor device. FIG. 11 illustrates a cross-sectional view 1100 of some embodiments corresponding to act 1306.

At act 1308, a middle ILD structure is formed over the lower ILD structure and laterally surrounding the plurality of memory cells. FIG. 11 illustrates a cross-sectional view 1100 of some embodiments corresponding to act 1308.

At act 1310, an upper ILD structure and an upper interconnect structure are formed over the middle ILD structure and the plurality of memory cells. FIG. 12 illustrates a cross-sectional view 1200 of some embodiments corresponding to act 1310.

In some embodiments, the present application provides a memory device. The memory device comprises a first transistor comprising a first source/drain region and a second source/drain region, wherein the first source/drain region and the second source/drain region are disposed in a semiconductor substrate. A dielectric structure is disposed over the semiconductor substrate. A first memory cell is disposed in the dielectric structure and over the semiconductor substrate, wherein the first memory cell has a first electrode and a second electrode, wherein the first electrode of the first memory cell is electrically coupled to the first source/drain region of the first transistor. A second memory cell is disposed in the dielectric structure and over the semiconductor substrate, wherein the second memory cell has a first electrode and a second electrode, wherein the first electrode of the second memory cell is electrically coupled to the second source/drain region of the first transistor.

In some embodiments, the present application provides a method for operating a memory device. The method comprises applying a first voltage to a gate electrode of a first transistor via a first word line. A second voltage is applied to a first electrode of a first memory cell via a first bit line, wherein a second electrode of the first memory cell is electrically coupled to a second bit line and to a first source/drain region of the first transistor. A third voltage is applied to a first electrode of a second memory cell via a third bit line. The third voltage is applied to a second electrode of the second memory cell via a fourth bit line, wherein a second source/drain region of the first transistor is electrically coupled to the fourth bit line, and wherein the third voltage is ground.

In some embodiments, the present application provides a method for forming a memory device. The method comprises forming a transistor on a semiconductor substrate. A lower interlayer dielectric (ILD) structure is formed over the semiconductor substrate. A lower portion of an interconnect structure is formed in the lower ILD structure, wherein the lower portion of the interconnect structure comprise a first set of conductive features and a second set of conductive features, wherein the first set of conductive features defines a first conductive path that is electrically coupled to a first source/drain region of the transistor, and the second set of conductive features defines a second conductive path that is different than the first conductive path and is electrically coupled to a second source/drain region of the transistor. A first memory cell is formed over the lower ILD structure and the lower portion of the interconnect structure, wherein the first memory cell is formed so that a first electrode of the first memory cell is electrically coupled to the first set of conductive features. A second memory cell is formed over both the lower ILD structure and the lower portion of the interconnect structure and laterally spaced from the first memory cell, wherein the second memory cell is formed so that a first electrode of the second memory cell is electrically coupled to the second set of conductive features.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:

a first transistor comprising a first source/drain region and a second source/drain region, wherein the first source/drain region and the second source/drain region are disposed in a semiconductor substrate;

a dielectric structure disposed over the semiconductor substrate;

a first memory cell disposed in the dielectric structure and over the semiconductor substrate, wherein the first memory cell has a first electrode and a second electrode, wherein the first electrode of the first memory cell is electrically coupled to the first source/drain region of the first transistor;

a second memory cell disposed in the dielectric structure and over the semiconductor substrate, wherein the second memory cell has a first electrode and a second electrode, wherein the first electrode of the second memory cell is electrically coupled to the second source/drain region of the first transistor;

a first bit line electrically coupled to the second electrode of the first memory cell;

a second bit line electrically coupled to the first electrode of the first memory cell;

a third bit line electrically coupled to the first electrode of the second memory cell; and a fourth bit line electrically coupled to the second electrode of the second memory cell.

2. The memory device of claim 1, further comprising:

a plurality of conductive layers disposed in the dielectric structure, wherein the dielectric structure is an interlayer dielectric (ILD) structure, wherein the plurality of conductive layers are disposed over one another, wherein each of the plurality of conductive layers comprises one or more conductive lines that are disposed in the dielectric structure, and wherein both the first memory cell and the second memory cell are disposed vertically between a first conductive layer of the plurality of conductive layers and a second conductive layer of the plurality of conductive layers.

3. The memory device of claim 2, wherein:

the second conductive layer overlies the first conductive layer; and the second conductive layer is disposed nearer the first conductive layer than any other of the plurality of conductive layers that overlie the first conductive layer.

4. The memory device of claim 3, wherein:

the first electrode of the first memory cell is electrically coupled to a first conductive line of the one or more conductive lines of the first conductive layer; and the first electrode of the second memory cell is electrically coupled to a second conductive line of the one or more conductive lines of the first conductive layer, wherein the second conductive line is different than the first conductive line.

5. The memory device of claim 4, wherein:

the second electrode of the first memory cell is electrically coupled to a third conductive line, wherein the third conductive line is one of the one or more conductive lines of the second conductive layer; and the second electrode of the second memory cell is electrically coupled to a fourth conductive line, wherein the fourth conductive line is one of the one or more conductive lines of the second conductive layer, and wherein the third conductive line is different than the fourth conductive line.

6. The memory device of claim 1, further comprising:

a second transistor comprising a first source/drain region and a second source/drain region;

a third memory cell having a first electrode and a second electrode, wherein the first electrode of the third memory cell is electrically coupled to the first source/drain region of the second transistor;

a fourth memory cell having a first electrode and a second electrode, wherein the first electrode of the fourth memory cell is electrically coupled to the second source/drain region of the second transistor;

wherein the first bit line is electrically coupled to the second electrode of the third memory cell;

wherein the second bit line is electrically coupled to the first electrode of the third memory cell;

wherein the third bit line is electrically coupled to the first electrode of the fourth memory cell; and wherein the fourth bit line is electrically coupled to the second electrode of the fourth memory cell.

7. The memory device of claim 1, wherein the first memory cell is a resistive random-access memory (RRAM) cell, a magnetoresistive random-access memory (MRAM) cell, a phase-change random-access memory (PCRAM) cell, a ferroelectric random-access memory (FeRAM) cell, or a conductive-bridging random-access memory (CBRAM) cell.

8. The memory device of claim 1, wherein:

the first memory cell comprises a data storage structure embedded in the dielectric structure, and the first electrode and the second electrode of the first memory cell are disposed on opposite sides of the data storage structure of the first memory cell; and the second memory cell comprises a data storage structure embedded in the dielectric structure and laterally spaced from the data storage structure of the first memory cell, and the first electrode and the second electrode of the second memory cell are disposed on opposite sides of the data storage structure of the second memory cell.

9. A method for operating a memory device, the method comprising:

applying a first voltage to a gate electrode of a first transistor via a first word line;

applying a second voltage to a first electrode of a first memory cell via a first bit line, wherein a second electrode of the first memory cell is electrically coupled to a second bit line and to a first source/drain region of the first transistor;

applying a third voltage to a first electrode of a second memory cell via a third bit line; and applying the third voltage to a second electrode of the second memory cell via a fourth bit line, wherein a second source/drain region of the first transistor is electrically coupled to the fourth bit line, and wherein the third voltage is ground.

10. The method of claim 9, wherein a difference between the first voltage and the third voltage is such that the first transistor is in an ON state.

11. The method of claim 9, further comprising:

applying the third voltage to a gate electrode of a second transistor via a second word line;

applying the second voltage to a first electrode of a third memory cell via the first bit line, wherein a second electrode of the third memory cell is electrically coupled to the second bit line and to a first source/drain region of the second transistor;

applying the third voltage to a first electrode of a fourth memory cell via the third bit line; and applying the third voltage to a second electrode of the fourth memory cell via the fourth bit line, wherein the second electrode of the fourth memory cell is electrically coupled to a second source/drain region of the second transistor.

12. The method of claim 11, wherein the third voltage is such that applying the third voltage to the gate electrode of the second transistor places the second transistor in an OFF state.

13. The method of claim 12, further comprising:

applying the first voltage to a gate electrode of a third transistor via the first word line;

applying a fourth voltage to a first electrode of a fifth memory cell via a fifth bit line, wherein a second electrode of the fifth memory cell is electrically coupled to a sixth bit line and a first source/drain region of a third transistor;

applying the fourth voltage to a first electrode of a sixth memory cell via a seventh bit line; and applying the fourth voltage to a second electrode of the sixth memory cell via an eighth bit line, wherein a second source/drain region of the third transistor is electrically coupled to the fourth bit line.

14. The method of claim 13, wherein a difference between the first voltage and the fourth voltage is such that the third transistor is in an OFF state.

15. The method of claim 14, further comprising:

applying the third voltage to a gate electrode of a fourth transistor via the second word line;

applying the fourth voltage to a first electrode of a seventh memory cell via the fifth bit line, wherein a second electrode of the fifth memory cell is electrically coupled to the sixth bit line and to a first source/drain region of the fourth transistor;

applying the fourth voltage to a first electrode of an eighth memory cell via the seventh bit line; and applying the fourth voltage to a second electrode of the eighth memory cell via the eighth bit line, wherein the second electrode of the eighth memory cell is electrically coupled to a second source/drain region of the fourth transistor.

16. The method of claim 15, further comprising:

the first voltage is between about 0.2 volts (V) and about 4 V; and the second voltage is between about −2 V and about 2 V.

17. The method of claim 9, wherein:

the first voltage is between about 0.2 volts (V) and about 4 V; and the second voltage is between about −2 V and about 2 V.

18. A method for forming a memory device, the method comprising:

forming a transistor on a semiconductor substrate;

forming a lower interlayer dielectric (ILD) structure over the semiconductor substrate;

forming a lower portion of an interconnect structure in the lower ILD structure, wherein the lower portion of the interconnect structure comprises a first set of conductive features and a second set of conductive features, wherein the first set of conductive features defines a first conductive path that is electrically coupled to a first source/drain region of the transistor, and the second set of conductive features defines a second conductive path that is different than the first conductive path and is electrically coupled to a second source/drain region of the transistor;

forming a first memory cell over the lower ILD structure and the lower portion of the interconnect structure, wherein the first memory cell is formed so that a first electrode of the first memory cell is electrically coupled to the first set of conductive features, wherein the first memory cell is formed so that each of the conductive features of the first set of conductive features are disposed vertically between the first memory cell and the semiconductor substrate, and wherein one of the conductive features of the first set of conductive features forms a first bit line; and forming a second memory cell over both the lower ILD structure and the lower portion of the interconnect structure and laterally spaced from the first memory cell, wherein the second memory cell is formed so that a first electrode of the second memory cell is electrically coupled to the second set of conductive features, wherein the second memory cell is formed so that each of the conductive features of the second set of conductive features are disposed vertically between the second memory cell and the semiconductor substrate, and wherein one of the conductive features of the second set of conductive features forms a second bit line.

19. The method of claim 18, further comprising:

forming an upper ILD structure over the lower ILD structure, over the lower portion of the interconnect structure, over the first memory cell, and over the second memory cell; and forming an upper portion of the interconnect structure in the upper ILD structure, wherein the upper portion of the interconnect structure comprises a third set of conductive features and a fourth set of conductive features, wherein the third set of conductive features defines a third conductive path that is electrically coupled to a second electrode of the first memory cell, wherein the fourth set of conductive features defines a fourth conductive path that is different than the third conductive path and is electrically coupled to a second electrode of the second memory cell.

20. The memory device of claim 1, further comprising:

a plurality of conductive layers disposed in the dielectric structure, wherein:

the plurality of conductive layers comprises a first conductive layer, a second conductive layer, a third conductive layer, and a fourth conductive layer;

the second conductive layer is disposed over the first conductive layer;

the third conductive layer is disposed over the second conductive layer;

the fourth conductive layer is disposed over the third conductive layer;

both the first memory cell and the second memory cell are disposed vertically between the second conductive layer and the third conductive layer;

a conductive line of the first conductive layer forms the second bit line;

a conductive line of the second conductive layer forms the third bit line;

a conductive line of the third conductive layer forms the first bit line; and a conductive line of the fourth conductive layer forms the fourth bit line.

* * * * *